United States Patent [19]

Matsushima et al.

[11] Patent Number: 5,744,820

[45] Date of Patent: Apr. 28, 1998

[54] LIQUID CRYSTAL DISPLAY DEVICE WITH A DISCONNECTED WIRING PATTERN ATTACHED BY INDEPENDENT METAL WIRING

[75] Inventors: Yasuhiro Matsushima, Kashihara; Toshihiro Yamashita, Nara; Takayuki Shimada, Yamatokoriyama, all of Japan

[73] Assignee: Sharp Kabushiki Kaisha, Osaka, Japan

[21] Appl. No.: 446,084

[22] Filed: May 15, 1995

[30] Foreign Application Priority Data

| Aug. 24, 1994 | [JP] | Japan | 6-199634 |
| Jan. 23, 1995 | [JP] | Japan | 7-008466 |
| Mar. 13, 1995 | [JP] | Japan | 7-053076 |

[51] Int. Cl.$^6$ .................... H01L 29/04; G02F 1/343
[52] U.S. Cl. .................... 257/59; 257/72; 349/54; 349/42; 349/43; 349/46; 349/149; 349/151
[58] Field of Search .................... 257/153, 154, 257/66, 59, 72; 359/57, 58, 59; 349/149, 151, 42, 43, 46, 54

[56] References Cited

U.S. PATENT DOCUMENTS 5,285,301  2/1994  Shirahashi et al. .................... 359/59

FOREIGN PATENT DOCUMENTS

| 0601652 A2 | 6/1994 | European Pat. Off. |
| 59-104173 | 6/1984 | Japan. |
| 5-198807 | 8/1993 | Japan. |

*Primary Examiner*—Tom Thomas
*Assistant Examiner*—Fetsum Abraham
*Attorney, Agent, or Firm*—Nixon & Vanderhye, P.C.

[57] ABSTRACT

With respect to at least one of a plurality of TFTs constituting a liquid crystal display device; a signal wiring having one end functioning as a gate electrode of the TFT is formed so as to include: a main portion, formed by patterning a first wiring layer, having a disconnected portion in the vicinity of an active region of the transistor; and a connecting portion, formed by patterning a second wiring layer which is different from the first wiring layer, for interconnecting the disconnected portion. Thus, the breakdown of the gate insulating film of the TFTs during the ion implantation process can be prevented.

18 Claims, 18 Drawing Sheets

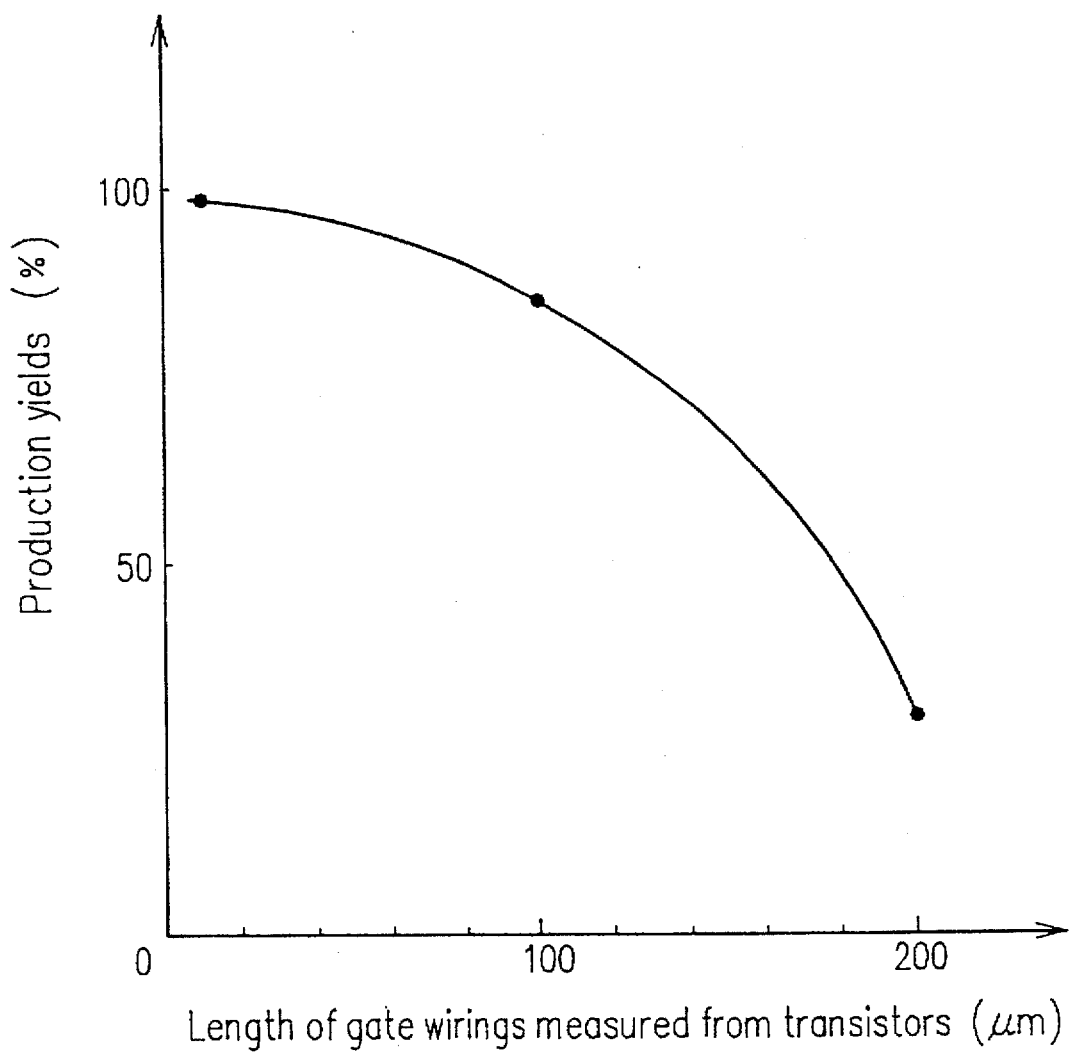

5,744,820

1

LIQUID CRYSTAL DISPLAY DEVICE WITH A DISCONNECTED WIRING PATTERN ATTACHED BY INDEPENDENT METAL WIRING

BACKGROUND OF THE INVENTION

1. Field of the Invention

The present invention relates to a driver monolithic liquid crystal display device; and more particularly to the driver circuit thereof. Specifically, the present invention relates to the structure of a signal wiring or a signal electrode for inputting and outputting a signal to a pixel in such a liquid crystal display device.

2. Description of the Related Art

FIG. 9 schematically shows the structure of a conventional driver monolithic liquid crystal display device 10. On a substrate 21, a gate driver circuit 22, a source driver circuit 23, and a TFT (Thin Film Transistor) array region 24 acting as a display unit are respectively provided. The substrate 21 may be a glass substrate or a quartz substrate. A counter electrode (not shown in FIG. 9) is also provided so as to oppose to the substrate 21.

In the TFT array region 24, a plurality of gate bus lines 1, which extend in parallel with each other from the gate driver circuit 22, are installed. There are also installed a plurality of source bus lines 2, which extend in parallel with each other from the source driver circuit 23 so that they are orthogonal to the gate bus lines 1. For each of the gate bus lines 1, is installed a common line 3 for additional capacitance 27 (hereinafter, referred to as the "additional capacitance common line" 3) in parallel with it.

In a rectangular region defined by any two adjacent source bus lines 2, any one gate bus line 1, and the additional capacitance common line 3 positioned as opposing to the gate bus line 1 of interest, the following components are disposed: a TFT 25; a pixel 26; and an additional capacitance 27. The gate electrode of the TFT 25 is connected to the gate bus line 1, while the source electrode thereof is connected to the source bus line 2. A liquid crystal is hermetically sealed between a pixel electrode connected to the drain electrode of the TFT 25 and a counter electrode on the counter substrate, thereby constituting the pixel 26. Each of the additional capacitance common line 3 connected in common to the respective additional capacitances 27 is also connected to an electrode 3a which is at the same potential as the counter electrode.

In such a liquid crystal display device 10, wirings become more complicated as a driver element of a liquid crystal panel becomes more miniaturized and finer. Further, the wirings become longer, and a number of intersections thereof increases.

FIG. 10 partially shows the structure of the conventional source driver (source driver circuit) 23 connected to the display unit (the TFT array region) 24.

The source driver circuit 23 is designed so that four groups of shift registers A to D are respectively driven by four-series of non-inverted clock signals $\phi A$ through $\phi D$ and inverted clock signals $/\phi A$ through $/\phi D$ transmitted in respective clock lines 13 to 16. In the drawings, the inverted clock signals, such as $/\phi D$, are indicated in form of "$\overline{\phi D}$" using a bar superscript.

In FIG. 10; A1 to A3, B1 to B3, C1 to C3 and D1 to D3 respectively represent unit shift resisters, each of which includes one inverter and two clocked inverters. Each of the unit shift resisters A1 to A3, B1 B3, C1 to C3 and D1 to D3 receives and outputs a shift signal, and also outputs a bit signal.

2

In the shift register in group D, for example, a pulse inputted to an input node $D_{in}$ is sequentially shifted in the respective unit shift registers D1, D2 and D3 in accordance with the clock signals $\phi D$ and $/\phi D$ which have opposite phases with each other, and then outputted to an output node $D_{out}$. The respective unit shift registers D1, D2 and D3 also provide the bit signal output to an analog switch As. The other groups of the unit shift resisters A1 to A3, B1 to B3, C1 to C3 are configured and operated in the same manner.

FIG. 11 shows a partial layout of one of the shift registers on the substrate shown in FIG. 10. In the drawing are shown an N-channel TFT 17 and a P-channel TFT 18, which are disposed adjacent to each other on an insulating substrate to constitute a clocked inverter. To one end of a transistor region 17a, having an island-like shape, of the N-channel TFT 17, a lower-voltage power-source line 11 is connected via contact holes 5. To one end of a transistor region 18a, having an island-like shape, of the P-channel TFT 18, a higher-voltage power-source line 12 is connected via the contact holes 5. The other ends of the above two transistor regions 17a and 18a are connected to the same signal wiring 19 via the contact holes 5, respectively.

In the vicinity of the transistor regions 17a and 18a are installed clock lines 13 to 16 in parallel with the trunk portion of the lower-voltage power-source line 11. Each of the clock lines 13 to 16 includes two segments and transmits the non-inverted clock signals $\phi A$ through $\phi D$ and the inverted clock signals $/\phi A$ through $/\phi D$, respectively.

Over the island-shaped transistor region 17a of the N-channel TFT 17, one end of a signal wiring 27 is extended, which has the other end connected to the non-inverted side $\phi D$ of the clock line 16. Over the island-shaped transistor region 18a of the P-channel TFT 18, one end of a signal wiring 28 is extended, which has the other end connected to the inverted side $/\phi D$ of the clock line 16. Furthermore, another signal wiring 29 is provided over the above two transistor regions 17a and 18a.

The respective signal wirings 27, 28 and 29, which are made of poly-Si or Al and also function as the gate electrodes of the N-channel and P-channel TFTs 17 and 18, include a relatively long portion (hereinafter, referred to as the "long signal wiring portion"), each of which is designated as A, B and C in FIG. 11. One end of such a long signal wiring portion is positioned substantially above a channel region of a TFT.

In such a structure, breakdown frequently occurs in a gate insulating film when ions, such as $P^+$, $B^+$ or the like, are implanted into the transistor region so as to determine the polarity of the channel. In the shift register, this kind of breakdown is observed particularly frequently in a signal input element of the clocked inverter for receiving a signal from a clock generator, or in an N-channel island or a P-channel island constituting a CMOS inverter. The breakdown disables the operation of the shift registers in the stages subsequent to the shift register suffering from the breakdown.

Below, a description will be given to the above-mentioned breakdown of the gate insulating film with reference to, as an example, the ion implantation process for forming the CMOS inverter.

FIG. 12 is a plan view showing a typical exemplary layout of a conventional CMOS inverter. FIGS. 13A through 13D are cross-sectional views taken along the line e—e' in FIG. 12, in the order in which the ion implantation process proceeds. In these drawings, like components are designated by like reference numerals.

On a glass substrate 21, the followings are sequentially formed in this order: polysilicon thin films 111 and 112 which will serve as the N-channel and the P-channel, respectively; a gate insulating film 113; and a gate electrode 114, as shown in FIG. 13A. The gate electrode 114 serves as the input to the inverter and is positioned over the N-channel and the P-channel. In each of FIGS. 12 and 13A–13D, the N-channel transistor (TFT) is illustrated in the left side and the P-channel transistor (TFT) is illustrated in the right side, respectively.

Then, a resist pattern 115 is formed in such a manner as to cover the P-channel TFT, followed by the implantation of P$^+$ ions into the N-channel TFT, thereby forming a channel region 116 (FIG. 13B). The resist pattern 115 is then removed.

Subsequently, a resist pattern 117 is formed in such a manner as to cover the N-channel TFT, followed by the implantation of B$^+$ ions into the P-channel TFT, thereby forming a channel region 118 (FIG. 13C). The resist pattern 117 is then removed.

Thereafter, an interlayer insulating film 119 is formed over the entire surface, followed by the formation of contact holes 120 therein. Then, a metal film is deposited and patterned so as to form electrodes 121, 122 and 123. At this stage, the electrode 121 for the N-channel TFT is connected to the lower-voltage power source, while the electrode 123 for the P-channel TFT is connected to the higher-voltage power source. The electrode 122 serves as the output of the inverter (FIG. 13D).

In the above process, when the ion implantation is actually conducted, the island-shaped polysilicon thin films 111 and 112 and the gate electrodes 114 already exist, while any metal layer has not been formed yet.

It can be considered that the aforementioned breakdown of the TFT is caused by the following reason: When a long signal wiring portion exists, which is made of the same material as that of the gate electrode positioned above the polysilicon thin films, charges are likely to leak away from the long signal wiring portion to the resist during the ion implantation process. As a result, the potential of the gate electrode is pulled up by that of the resist. Consequently, a potential difference is generated between the gate electrode being ion-implanted and the polysilicon thin film with the gate insulating film interposed therebetween, thereby causing the breakdown of the gate insulating film.

The breakdown of the gate insulating film has become a problem not only in the transistor constituting the inverter or the clocked inverter of the shift register, but also in a transistor constituting an analog switch or a transistor used for a pixel. Below, a brief description will be given to such problematic cases.

FIG. 14A is an exemplary layout diagram showing the vicinity of a conventional analog switch. FIG. 14B is a cross-sectional view taken along the line f—f' in FIG. 14A. In these drawings, like components are designated by like reference numerals.

In the drawings are shown: an analog switch 133 formed on the insulating substrate 21; and a signal wiring 131 having one end connected to the output of a shift register (not shown in FIG. 14A). The signal wiring 131 passes through a buffer region and underpasses three video lines 134 indicated by B, G, and R, so as to further extend over the channel of the transistor region (the polysilicon thin film) 133a constituting the analog switch 133. Video signals are supplied from the respective video lines 134 to the analog switch 133 via respective other signal wirings 135. The video signals, sampled by the analog switch 133, are then written into a pixel on the display unit 24 (not shown in FIG. 14A) via signal wirings 132.

The process of forming the analog switch 133 on the insulating substrate 21 is basically the same as the process of forming one of the transistors in the CMOS inverter, previously described with references to FIGS. 12 and 13A to 13D.

In the above structure, the signal wirings 131, which has one end functioning as the gate electrode of the transistor constituting the analog switch 133, is installed over a long distance. Thus, the aforementioned breakdown of the gate insulating film is incurred.

FIG. 15 is an enlarged view of a pixel on a conventional active-matrix substrate.

In FIG. 15 are shown: source bus lines 2$a$ and 2$b$; gate bus lines 1$a$ and 1$b$; a pixel electrode 25$a$; and a TFT for a pixel (hereinafter, referred to as the "pixel TFT" 25. The reference numerals used here correspond to those used in FIG. 9. The additional capacitance common lines previously explained are omitted in FIG. 15 for simplification.

In the structure shown in FIG. 15, the gate bus line 1$a$ connected to a gate electrodes of the pixel TFT 25 is considerably long. Therefore, the breakdown of the gate insulating film of the pixel TFT 25 due to charge-up is incurred in the ion implantation process.

As an example of the method for preventing the charge-up in the ion implantation into the TFTs, Japanese Laid-Open Patent Publication No. 59-104173 discloses one in which a conductive thin film is deposited over the entire surface of the insulating substrate when implanting ions into the TFTs. By releasing charges produced in the ion implantation process to the outside through the thus deposited conductive thin film, the degree of damage to the TFTs is reduced. However, the disclosed method not only requires an additional process step of depositing the conductive thin film, but also requires an extra process step of thermally oxidizing the conductive thin film.

Another method is disclosed in Japanese Laid-Open Patent Publication No. 5-198807, in which the gate electrodes of all the TFTs are collectively short-circuited in the periphery of the substrate, and the ion implantation is performed in an atmosphere at a controlled pressure. However, the method also requires an additional step of separating the short-circuited gate electrodes after the ion implantation process is completed, thereby increasing the total number of process steps.

SUMMARY OF THE INVENTION

The driver monolithic liquid crystal display device of this invention includes: a plurality of top-gate type thin-film transistors formed on an insulative substrate; and a plurality of signal wirings for providing a signal to a gate electrode of each of the thin-film transistors, wherein at least one signal wiring which is selected among the plurality of the signal wirings includes: a main portion formed of the same material as that of the gate electrode by patterning a first wiring layer, the main portion having a disconnected portion; and a connecting portion for interconnecting the disconnected portion, the connecting portion being formed by patterning a second wiring layer.

In one embodiment, the disconnected portion is provided in the vicinity of an active layer of the thin-film transistor.

In another embodiment, the plurality of the thin-film transistors constitute a shift register, and the selected signal wiring provides a clock signal from a clock line to the thin-film transistors.

In still another embodiment, the plurality of the thin-film transistors constitute an analog switch, and the plurality of signal wirings are provided as intersecting with video lines, the selected signal wiring providing an output of a shift register to the analog switch.

In still another embodiment, the plurality of the thin-film transistors include at least one N-channel thin-film transistor and at least one P-channel thin-film transistor; the at least one N-channel transistor and the at least one P-channel transistor constituting an inverter included in a shift register, and the selected signal wiring is connected to the inverter and is provided so as to extend over respective channels of the N-channel and P-channel thin-film transistors constituting the inverter. The disconnected portion of the selected signal wiring is provided between respective active layers of the N-channel and P-channel thin-film transistors. Preferably, the inverter is a clocked inverter.

In still another embodiment, the plurality of the thin-film transistors are provided as corresponding to respective pixels constituting a display unit, and the selected signal wiring is a gate bus line. Preferably, the disconnected portion of the gate bus line is provided at an intersection between the gate bus line and a source bus line for each pixel. Alternatively, the disconnected portion of the gate bus line is provided between adjacent source bus lines for each pixel.

In still another embodiment, the second wiring layer is an upper wiring layer formed of aluminum.

In still another embodiment, the second wiring layer is an upper wiring layer formed of a material selected from a group consisting of TiW, Ti, Mo, W and WSi.

In still another embodiment, respective non-selected signal wirings among the plurality of the signal wirings have no disconnected portion.

According to another aspect of the invention, the driver monolithic liquid crystal display device includes a plurality of thin-film transistors formed on an insulative substrate, wherein at least one thin-film transistor which is selected among the plurality of the thin-film transistors is divided into a plurality of segments and has a channel divided in a channel width direction into a plurality of channel segments, a total width of the channel being 100 μm or more, the selected thin-film transistor including a gate electrode, the gate electrode including: a main portion formed by patterning a first wiring layer, the main portion having a disconnected portion between the adjacent segments of the selected thin-film transistor; and a connecting portion for interconnecting the disconnected portion, the connecting portion being formed by patterning a second wiring layer.

In one embodiment, the second wiring layer is an upper wiring layer formed of aluminum.

In another embodiment, the second wiring layer is an upper wiring layer formed of a material selected from a group consisting of TiW, Ti, Mo, W and WSi.

In still another embodiment, respective non-selected thin-film transistors among the plurality of the thin-film transistors have a gate electrode having no disconnected portion.

According to still another aspect of the invention, the driver monolithic liquid crystal display device includes a plurality of top-gate type thin-film transistors formed on an insulative substrate, wherein at least one thin-film transistor which is selected among the plurality of the thin-film transistors has a dummy signal wiring connected to a gate electrode thereof, no signal being applied to the dummy signal wiring, the dummy signal wiring being formed of the same material as that of the gate electrode by patterning a predetermined wiring layer, the dummy signal wiring having a continuous wiring pattern.

In one embodiment, a length of the dummy signal wiring is longer than a gate wiring length of other signal wirings each of which provides a signal to a gate electrode of the non-selected thin-film transistors among the plurality of the thin-film transistors.

Thus, the invention described herein makes possible the advantage of providing a driver monolithic liquid crystal display device capable of preventing the breakdown of a gate insulating film of a TFT in the ion implantation process without increasing the number of process steps.

This and other advantages of the present invention will become apparent to those skilled in the art upon reading and understanding the following detailed description with reference to the accompanying figures.

BRIEF DESCRIPTION OF THE DRAWINGS

FIG. 3 is a graph indicating a relationship between a gate wiring length and production yields.

DESCRIPTION OF THE PREFERRED EMBODIMENTS

EXAMPLE 1

Figure 1:
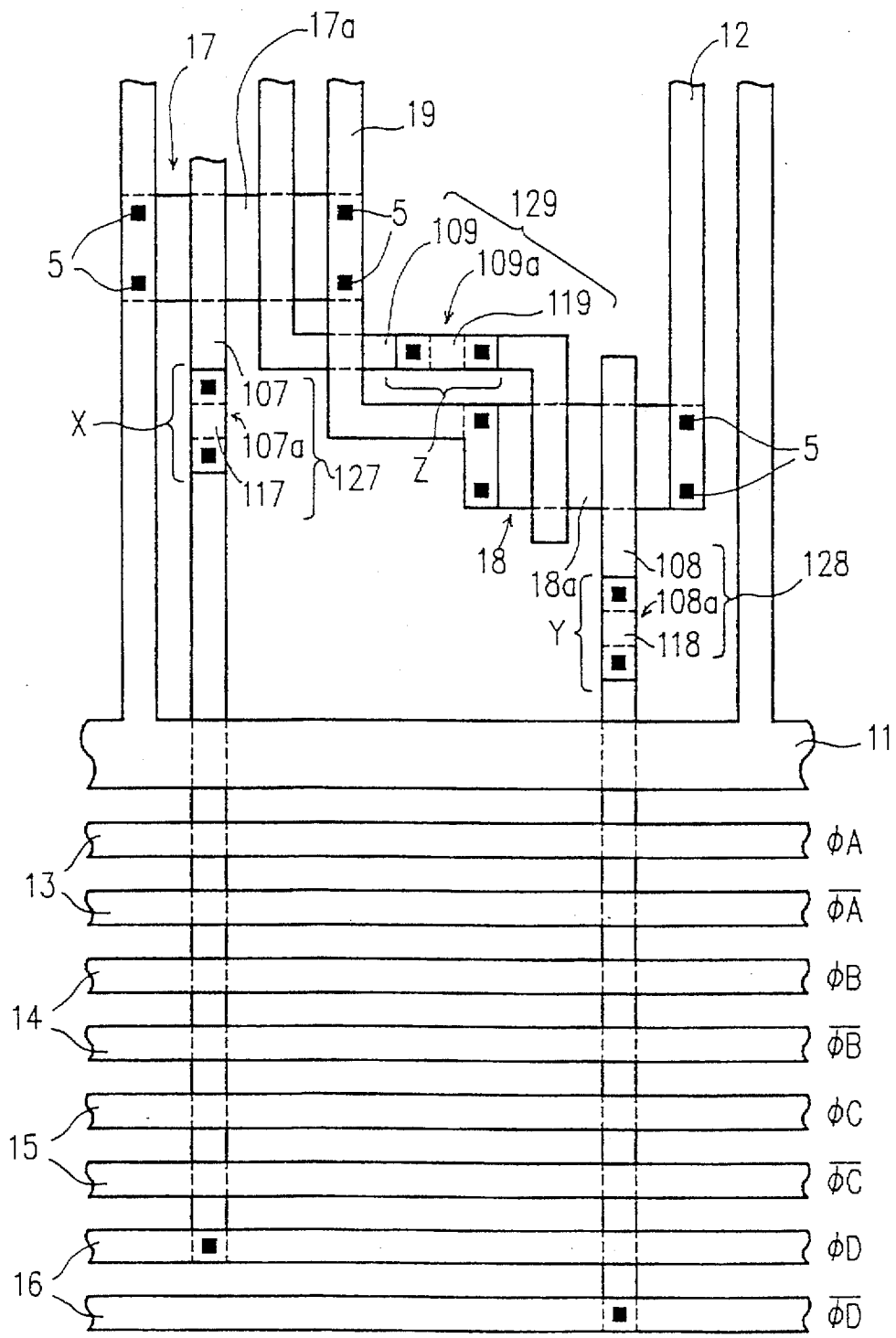
FIG. 1 is a schematic plan view illustrating a portion of a shift register constituting a driver monolithic liquid crystal display device according to a first example of the present invention.
Figure 2A:
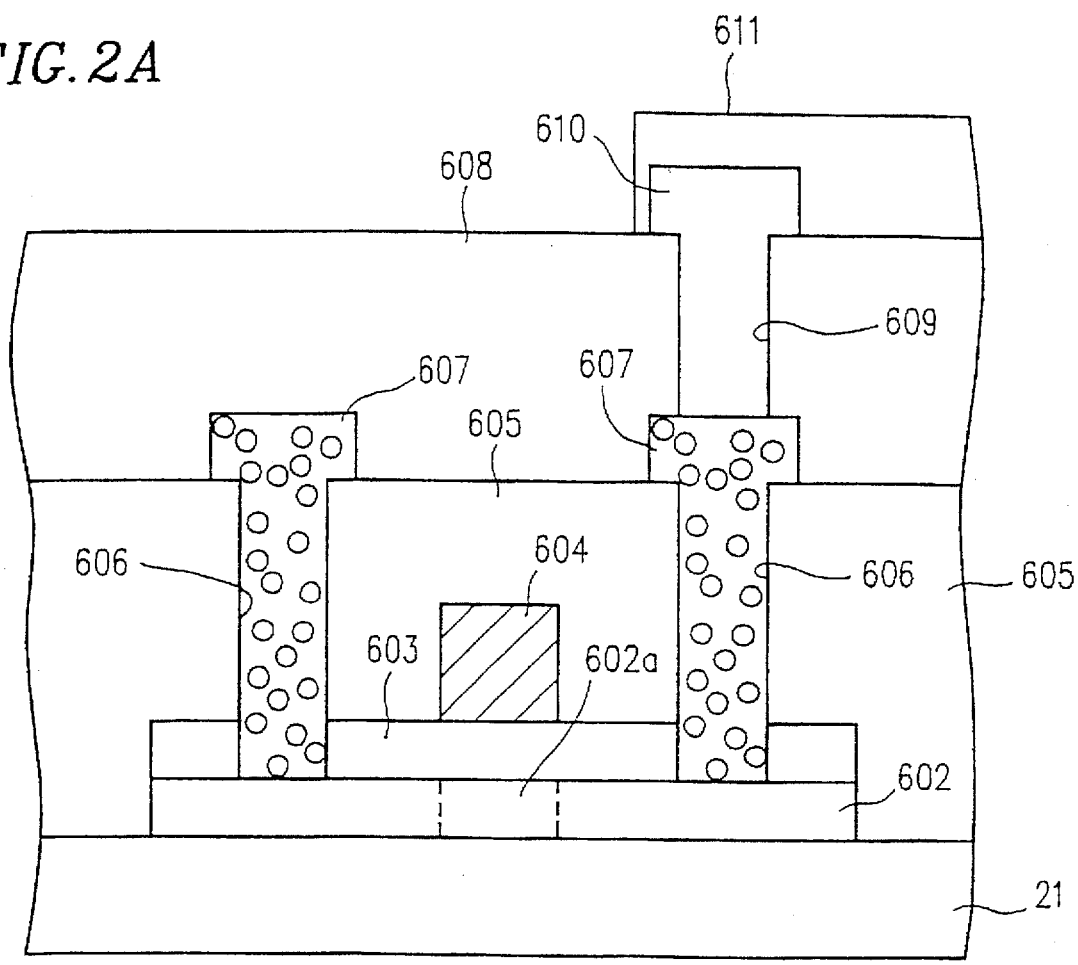
FIG. 2A is a cross-sectional view of a pixel TFT constituting the driver monolithic liquid crystal display device according to the first example of the present invention.
Figure 2B:
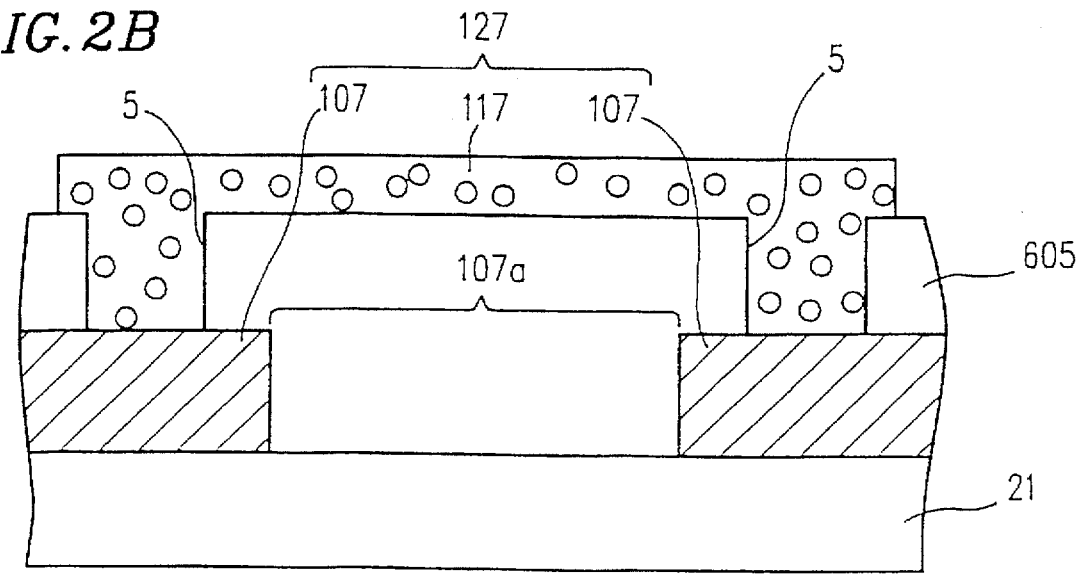
FIG. 2B is a cross-sectional view of a portion X of the shift register shown in FIG. 1.

FIG. 1 is a schematic plan view for illustrating a driver monolithic liquid-crystal display device according to a first example of the present invention. Specifically, a shift register in the driver element of the liquid crystal display device is partially shown in FIG. 1. FIG. 2A is a cross-sectional view of a pixel TFT constituting the driver monolithic liquid-crystal display device of the present example. FIG. 2B is a view showing the cross-sectional structure of the portion indicated by X in FIG. 1. Although only the portion X of FIG. 1 is shown here, the portions indicated by Y and Z in FIG. 1 also have the similar cross-sectional structures to that of the portion X.

Figure 11:
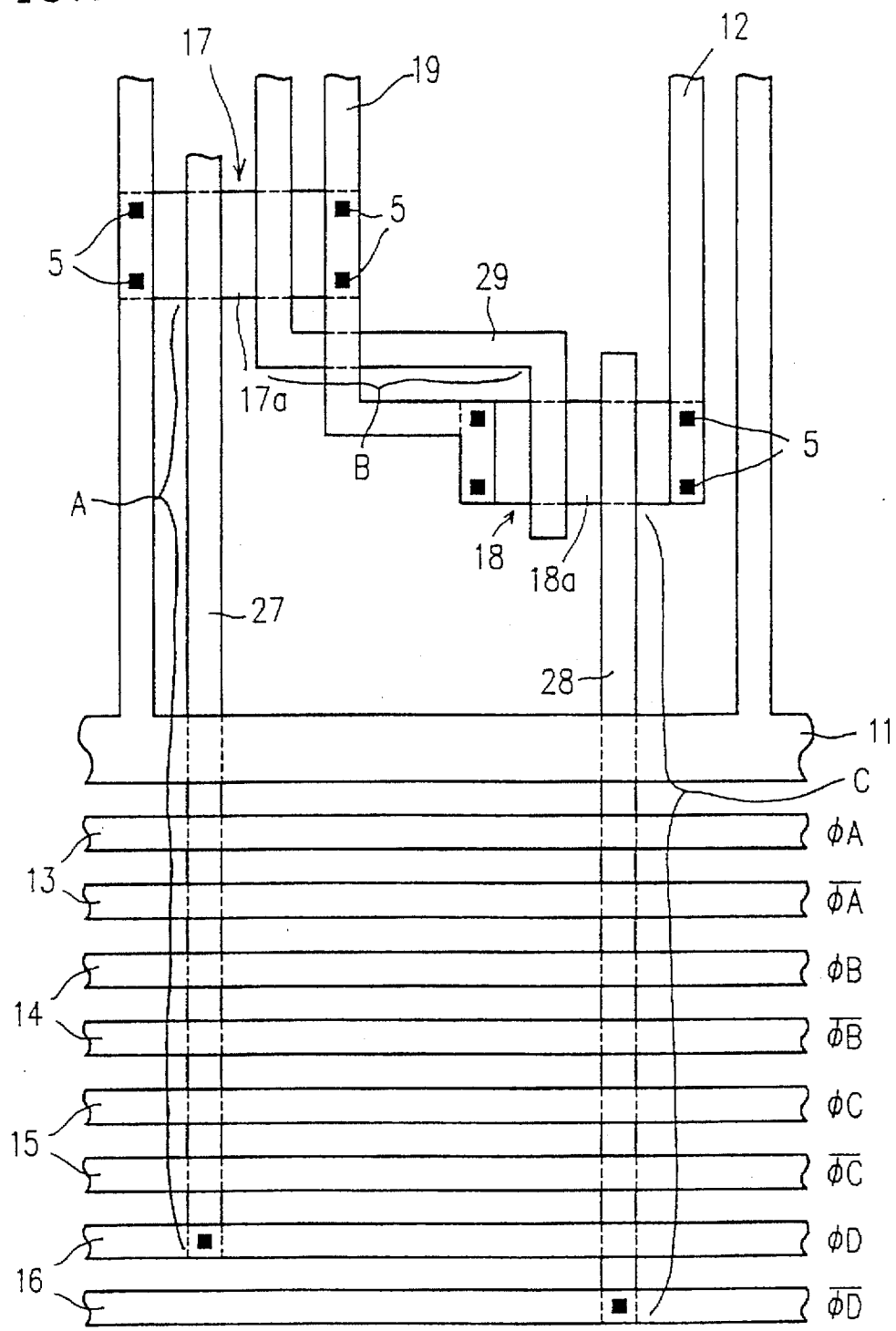
FIG. 11 is a schematic plan view illustrating a portion of a typical conventional shift register included in the source driver circuit shown in FIG. 10.
Figure 12:
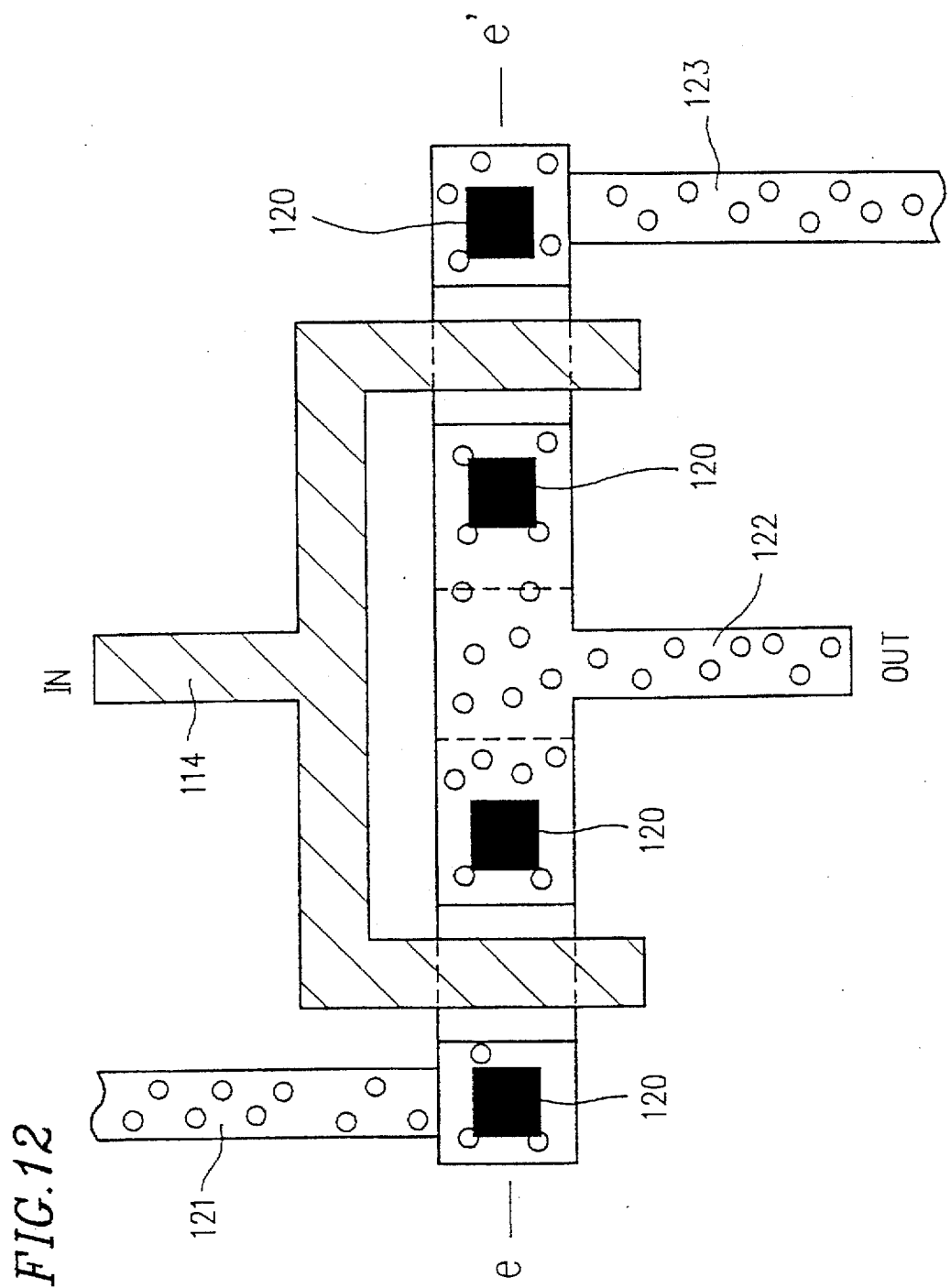
FIG. 12 is a schematic plan view illustrating a layout of a typical conventional CMOS inverter.
Figure 13A:
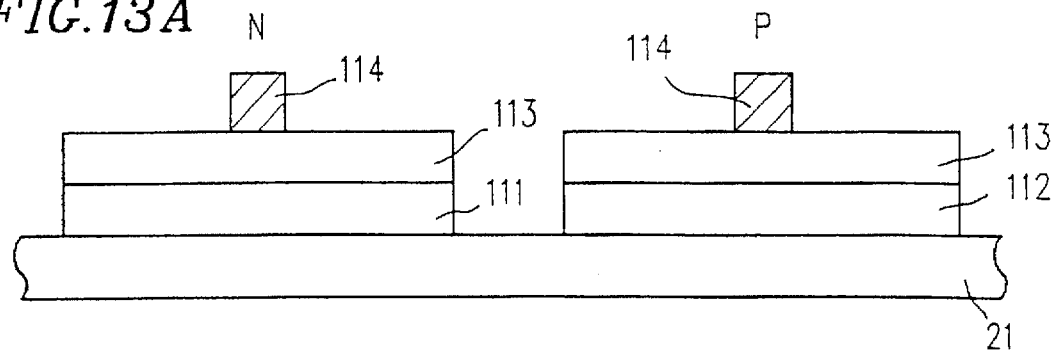
FIGS. 13A to 13D are cross-sectional views, taken along line e—e' in FIG. 12, illustrating process steps for the CMOS inverter shown in FIG. 12.
Figure 13B:
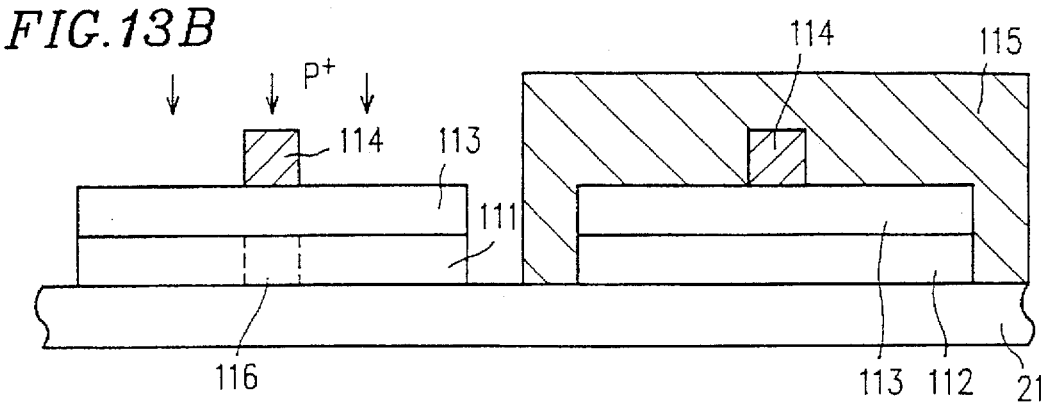
Figure 13C:
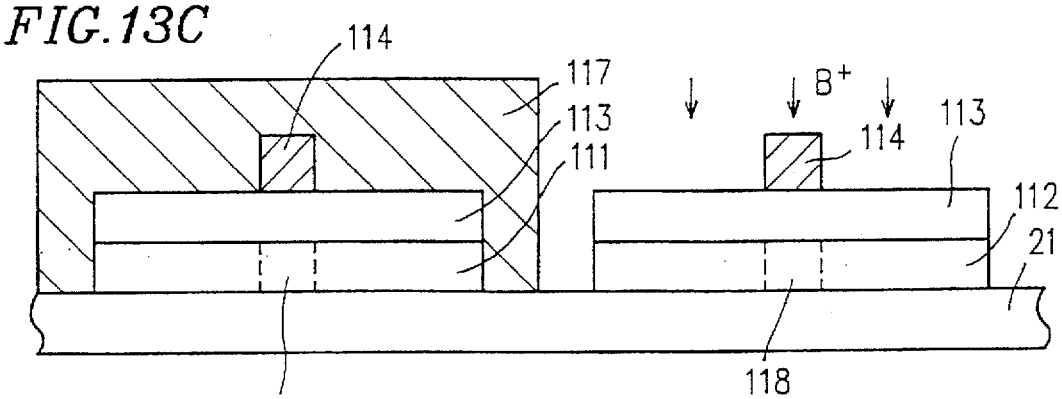
Figure 13D:
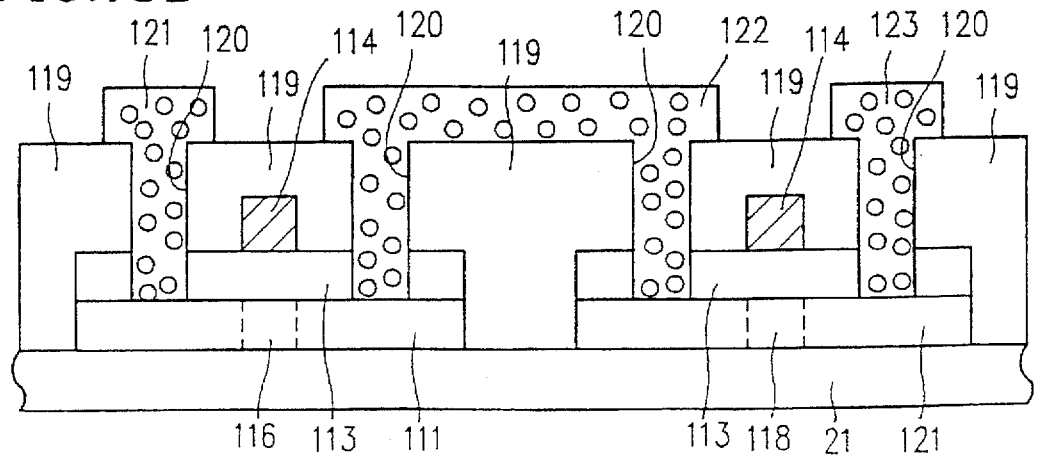

In FIGS. 1, 2A and 2B, like reference numerals used for the components of the conventional shift register in FIG. 11 designate like components. Thus, detailed description thereof is omitted herein.

A signal wiring 127 is used for inputting a non-inverted clock signal φD from a non-inverted side of a clock line 16 to a gate electrode of a TFT 17. The signal wiring 127 is formed so as to include: a main portion 107, which is formed by patterning a polysilicon film (a first wiring layer), having a disconnected portion 107a in the vicinity of a transistor region (an active layer) 17a of the TFT 17; and a connecting portion 117, which is formed by patterning an aluminum film, for interconnecting the disconnected portion 107a, as shown in FIG. 2B.

A signal wiring 128 is used for inputting an inverted clock signal /φD from an inverted side of the clock line 16 to a gate electrode of a TFT 18. Similarly to the signal wiring 127, the signal wiring 128 is formed so as to include: a main portion 108, which is formed by patterning the polysilicon film (the first wiring layer), having a disconnected portion 108a in the vicinity of a transistor region (an active layer) 18a of the TFT 18; and a connecting portion 118, which is formed by patterning the aluminum film, for interconnecting the disconnected portion 108a.

A signal wiring 129 is installed over the above two transistor regions 17a and 18a. The signal wiring 129 is formed so as to include: a main portion 109, which is formed by patterning the polysilicon film (the first wiring layer), having a disconnected portion 109a between the transistor regions 17a and 18a; and a connecting portion 119, which is formed by patterning the aluminum film, for interconnecting the disconnected portion 109a.

The above-mentioned main portions 107, 108 and 109 of the signal wirings 127, 128 and 129 are connected to the connecting portions 117, 118 and 119, respectively, via contact holes 5.

Figure 16:
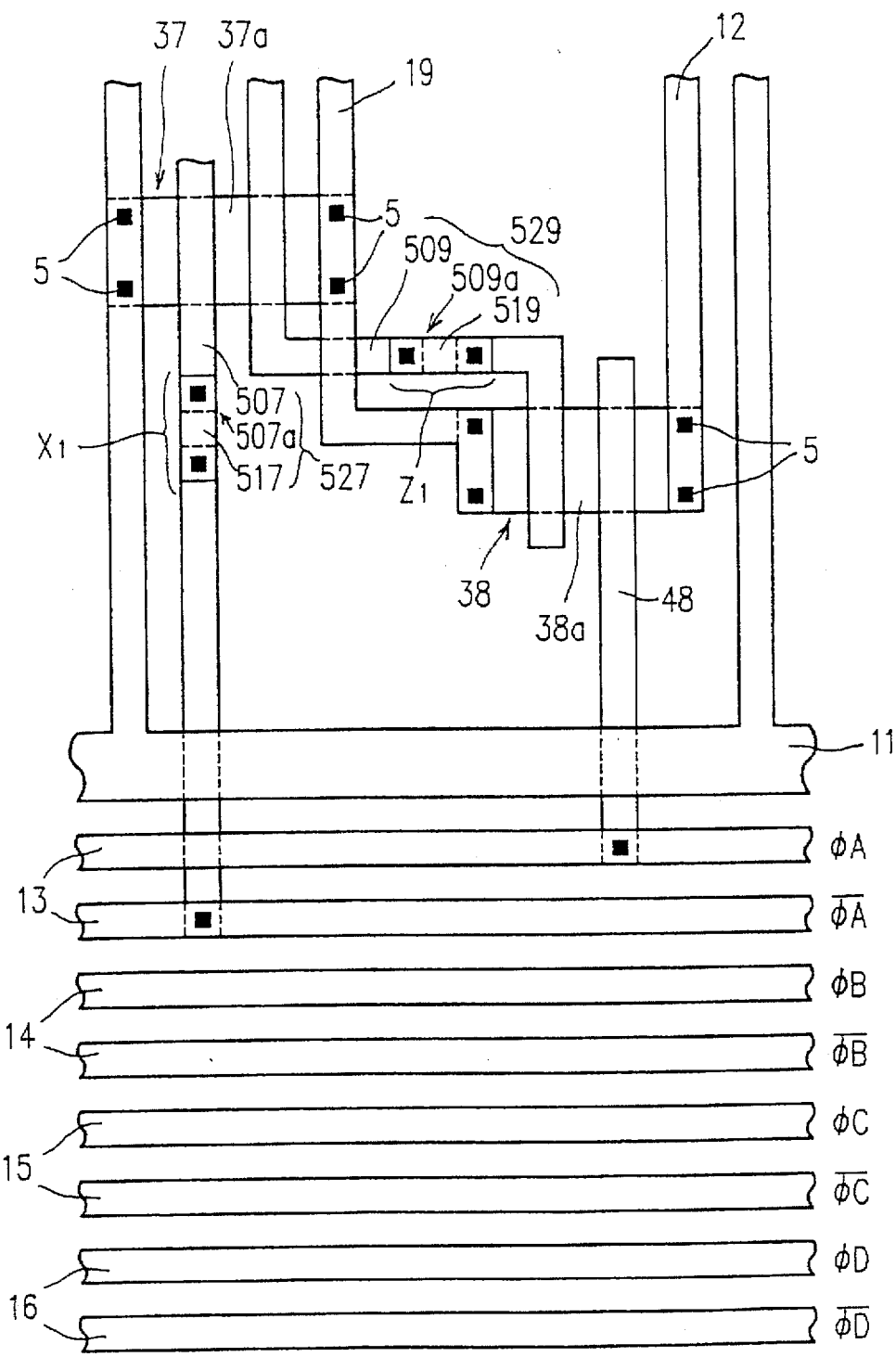
FIG. 16 is a schematic plan view illustrating another portion of the shift register constituting the driver monolithic liquid crystal display device according to the first example of the present invention.

FIG. 16 shows another portion of the shift register in the driver element of the liquid crystal display device according to the first example of the present invention. Portions X1 and Z1 in FIG. 16 respectively have the similar cross-sectional structure as the portion X in FIG. 1, which is shown in FIG. 2B.

In FIG. 16, like components as in FIG. 1 are designated with like reference numerals, and therefore, detailed description thereof is omitted herein.

As shown in FIG. 16, an N-channel TFT 37 and a P-channel TFT 38 are provided adjacent to each other on an insulative substrate so as to constitute a clocked inverter. To one end of a transistor region (an active layer) 37a of the N-channel TFT 37, a lower-voltage power-source line 11 is connected via contact holes 5. To one end of a transistor region (an active layer) 38a of the P-channel TFT 38 is connected a higher-voltage power-source line 12 via the contact holes 5. The other ends of the above two transistor regions 37a and 38a are connected to the same signal wiring 19 via the contact holes 5.

A signal wiring 527 is used for inputting an inverted clock signal /φA from an inverted side of a clock line 13 to the gate electrode of the N-channel TFT 37. The signal wiring 527 is formed so as to include: a main portion 507, which is formed by patterning the polysilicon film (the first wiring layer), having a disconnected portion 507a in the vicinity of the transistor region 37a of the TFT 37; and a connecting portion 517, which is formed by patterning the aluminum film, for interconnecting the disconnected portion 507a.

A signal wiring 48 is used for inputting a non-inverted clock signal φA from the non-inverted side of the clock line 13 to a gate electrode of the P-channel TFT 38. Compared with the other signal wirings, the signal wiring 48 has a relatively short gate wiring length, that is, a distance from the gate electrode of the P-channel TFT 38 to such a signal line as the clock line 13. Therefore, no disconnected portion is provided therein, unlike the other signal wirings such as the signal wiring 527.

A signal wiring 529 is installed over the above two transistor regions 37a and 38a. The signal wiring 529 is formed so as to include: a main portion 509, which is formed by patterning the polysilicon film (the first wiring layer), having a disconnected portion 509a between the transistor regions 37a and 38a; and a connecting portion 519, which is formed by patterning the aluminum film, for interconnecting the disconnected portion 509a.

The above description uses, as an example, the structure of the clocked inverter included in the shift register. No explanation regarding the structure of the inverter, which is also included in the shift register of this example, has been shown. However, at least one of a plurality of inverters constituting the shift register is also formed to have the similar structure of the signal wiring in the clocked inverter as shown in FIG. 1 or 16.

For example, a signal wiring installed over both the transistor regions of each of the N-channel TFT and the P-channel TFT, which constitute the inverter, is formed so as to include: a main portion, which is formed by patterning the polysilicon film (the first wiring layer), having a disconnected portion between the two transistor regions and; a connecting portion, formed by patterning the aluminum film, for interconnecting the disconnected portion.

Below, the manufacturing process of the liquid crystal display device in accordance with the first example of the present invention will be described with reference to FIG. 2A.

Initially, a polysilicon thin film 602, which will serve as a semiconductor layer 602, is formed over the entire insulating substrate 21 by, for example, CVD technique. Next, an insulating film 603, which will serve as a gate insulating film 603 later, is formed by such a method as CVD, sputtering, or thermal oxidization of the top surface of the polysilicon thin film 602. Preferably, the thickness of the gate insulating film 603 is approximately 100 nm.

Then, the polysilicon thin film 602 and the insulating film 603 are patterned into a predetermined design, thereby forming the island-like semiconductor layer 602 having a thickness of about 40 nm to 80 nm. Alternatively, the gate insulating film 603 described above may be formed after patterning the semiconductor layer 602.

It is also possible, prior to the formation of the insulating film 603, to perform such processing as laser annealing or annealing in nitrogen atmosphere in order to enhance the crystallinity of the polysilicon thin film 602.

Subsequently, another polysilicon thin film, which will serve as gate bus lines later, is formed to a thickness of, typically, 450 nm by CVD, followed by doping therein, thereby obtaining a low-resistance polysilicon thin film.

Thereafter, the respective main portions 107, 108 and 109 of the signal wirings 127, 128 and 129 each having configurations as shown in FIG. 1, the respective main portions 507 and 509 of the signal wirings 527 and 529 each having configurations as shown in FIG. 16, and the signal wiring 48 as shown in FIG. 16, are respectively formed by patterning the low-resistance polysilicon thin film. A portion of the respective main portions 107, 108 and 109 of the signal wirings 127, 128 and 129 functions as the gate electrode of the transistors 17 and 18 included in the above-mentioned shift register shown in FIG. 1. Similarly, a portion of the respective main portions 507 and 509 of the signal wirings 527 and 529 as well as the signal wiring 48 functions as the gate electrode of the transistors 37 and 38 included in the above-mentioned shift register shown in FIG. 16.

During the above steps, a gate electrode 604 shown in FIG. 2A is also formed in the pixel TFT. Alternatively, the gate electrode 604 in the pixel TFT may be composed of a metal such as Al in a different process.

Next, by using the gate electrode 604 and a resist formed by photolithography as a mask, ions are implanted into the semiconductor layer 602, except for the region underlying the gate determine 604, in order to determine the polarity (P-type or N-type) of the TFT. Thus, a channel region 602a shown in FIG. 2A is formed. At the same time, channel regions are also formed in the respective transistor regions 17a, 18a, 37a and 38a shown in FIGS. 1 and 16.

After that, a first interlayer insulating film 605 is formed to a thickness, for example, of 700 nm over the entire surface of the substrate, followed by the formation of contact holes 606 in the first interlayer insulating film 605. Meanwhile, as shown in FIG. 1, the contact holes 5 are also formed in the respective transistor regions 17a and 18a as well as at the respective end portions of the main portions 107 to 109 in the vicinity of the disconnected portions 107a to 109a.

Contact holes are further formed in the respective transistor regions 37a and 38a as well as at the respective end portions of the main portions 507 and 509 in the vicinity of the disconnected portions 507a and 509a, as shown in FIG. 16.

Next, wiring patterns 607 are formed to a thickness, for example, of 600 nm using such a metal having a low resistance as Al. At the same step, the respective connecting portions 117, 118 and 119 for interconnecting the disconnected portions 107a, 108a and 109a of the signal wirings 127, 128 and 129, shown in FIGS. 1 and 2B, are also formed. Furthermore, the connecting portions 517 and 519 for interconnecting the disconnected portions 507a and 509a of the signal wirings 527 and 529, shown in FIG. 16, are also formed.

In the formation step of the pixel TFT according to the present example as shown in FIG. 2A, the contact holes 606 to be used for connecting a drain electrode of the TFT to a pixel electrode 611 are formed after forming the first interlayer insulating film 605 in the pixel TFT region, thereby preventing contact failure. The contact hole 606 is filled with such a metal 607 as Al, so that a difference in level between the drain electrode and the pixel electrode 611 is reduced.

Thereafter, a second interlayer insulating film 608 is formed to a thickness, for example, of 600 nm, followed by the formation of contact holes 609 therein. The contact holes 609 are filled with such a metal 610 as TiW, WSi, Mo, or W. The metal 610 provides ohmic contact between the metal 607, such as Al, filled in the contact hole 606 and the pixel electrode 611 formed of, for example, ITO.

Next, the pixel electrode 611 is formed to a thickness, for example, of about 150 nm by patterning the transparent electrode of ITO.

Through the foregoing process, the pixel element, as shown in FIG. 2A, and the TFTs 17, 18, 37 and 38 as shown in FIGS. 1 and 16 of the shift register, are formed.

Thus, in the present example, the signal wirings 127, 128, 129, 527 and 529 are provided for a plurality of the TFTs 17, 18, 37 and 38 constituting the liquid crystal display device. A portion of each of the respective signal wirings 127, 128, 129, 527 and 529 functions as the gate electrode of the TFTs 17, 18, 37 and 38. Furthermore, the respective signal wirings 127, 128, 129, 527 and 529 are formed to include: the main portions 107, 108, 109, 507 and 509 made of polysilicon and respectively having the disconnected portions 107a, 108a, 109a, 507a and 509a in the vicinity of the transistor regions of the TFTs 17, 18, 37 and 38; and the connecting portions 117, 118, 119, 517 and 519 made of aluminum and respectively interconnecting the disconnected portions 107a, 108a, 109a, 507a and 509a.

Ion implantation process, which may cause the charge-up of the signal wirings 127, 128, 129, 527 and 529, is conducted after forming the main portions 107, 108, 109, 507 and 509 thereof, and thereafter, the disconnected portions 107a, 108a, 109a, 507a and 509a are interconnected by forming the connecting portions 117, 118, 119, 517 and 519. Thus, the breakdown of the gate insulating film of the TFTs in the ion implantation process is prevented.

Accordingly, in the driver monolithic liquid crystal display device, the possibility of defects of the shift registers, which contain such TFTs as their circuit elements, can be reduced significantly.

Moreover, each of the signal wirings 127, 128 and 527 for inputting the clock signals from the clock lines 13 through 16 to the gate electrodes of the TFTs is formed to include: the above-mentioned main portions 107, 108 and 507 having the disconnected portions 107a, 108a and 507a; and the connecting portions 117, 118 and 517 for interconnecting the disconnected portions 107a, 108a and 507a. Consequently, in addition to preventing the breakdown of the gate insulating film, it also becomes possible to equalize resistance of the wirings between the respective clock lines and the shift register, by adjusting the lengths of the disconnected portions as well as resistances of the main portions and the connecting portions in the signal wirings 127, 128 and 527.

The inventors of the present application have fabricated three sets of 300-stage shift registers, each having distances between the TFTs and the connecting portions made of aluminum (i.e., lengths of the gate wirings measured from the transistors) of 10 μm, 100 μm, and 200 μm, respectively. The production yields of the shift registers are evaluated with respect to the quality of outputs from their respective 300-th stages.

In FIG. 3, the horizontal axis represents the distance between the TFTs and the metal connecting portions (lengths of the gate wirings measured from the transistors), and the vertical axis represents the production yield of 300-stage shift registers. The production yields obtained in the experiment were: 30% when the distance between the TFT and the connecting portions was 200 μm; 85% when the distance was 100 μm; and 98% when the distance was 10 μm. Thus, the production yield of the shift registers was increased by reducing the distance between the TFTs and the metal connecting portions.

EXAMPLE 2

Figure 4:
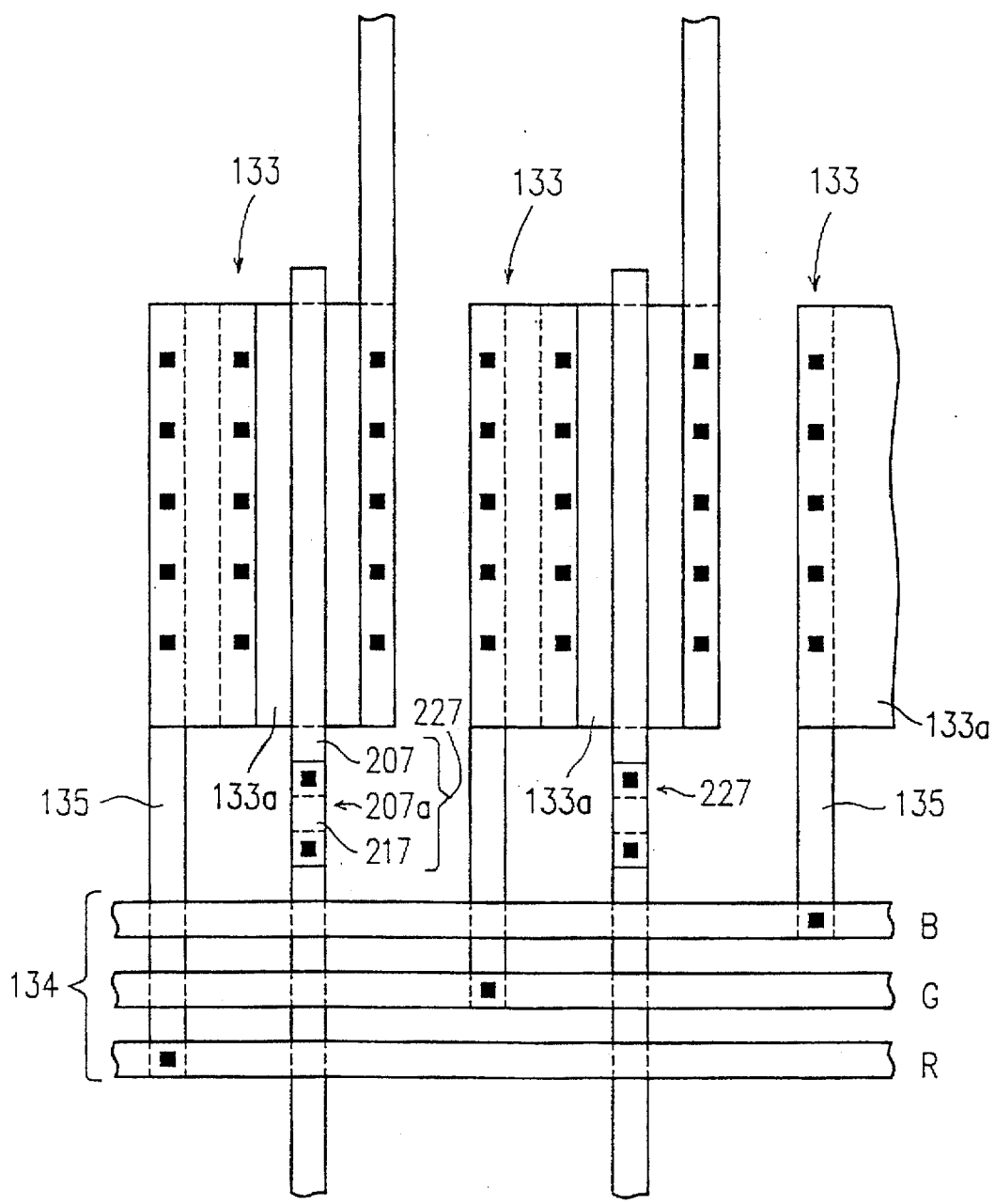
FIG. 4 is a schematic plan view illustrating a portion of an analog switch constituting a driver monolithic liquid crystal display device according to a second example of the present invention.

FIG. 4 is a view illustrating a liquid crystal display device according to a second example of the present invention.

In the first example described above, the signal wirings connected to the gate electrode, namely, the gate lines, for inputting the clock signals from the clock lines to the clocked inverters in the shift register are formed to have the disconnected portions. In the present example, the similar structure to that in the first example is implemented in a gate input element of an analog switch constituting the driver circuit of the driver monolithic liquid crystal display device.

Figure 14A:
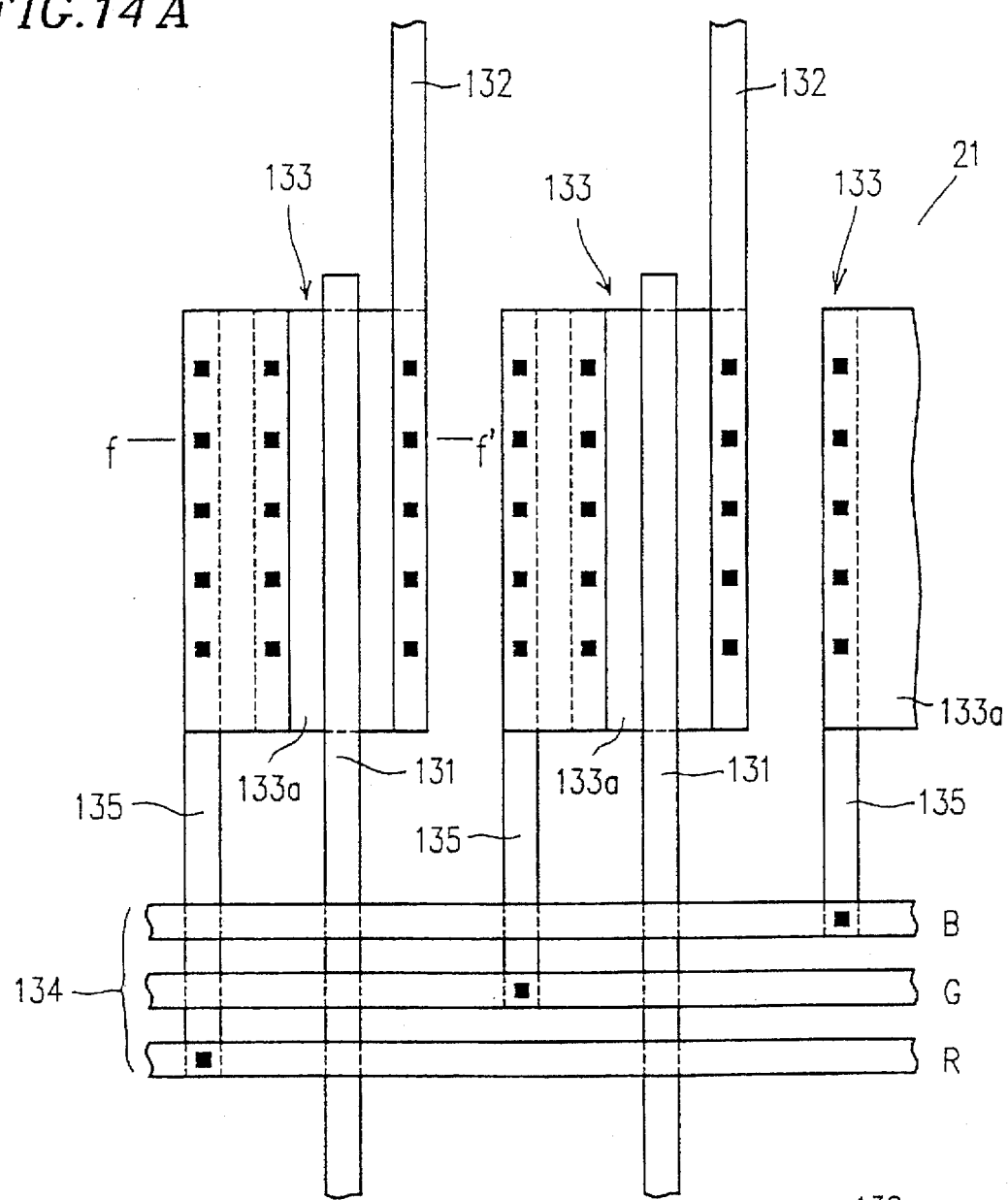
FIG. 14A is an exemplary schematic plan view illustrating a typical conventional analog switch constituting a conventional driver monolithic liquid crystal display device.
Figure 14B:
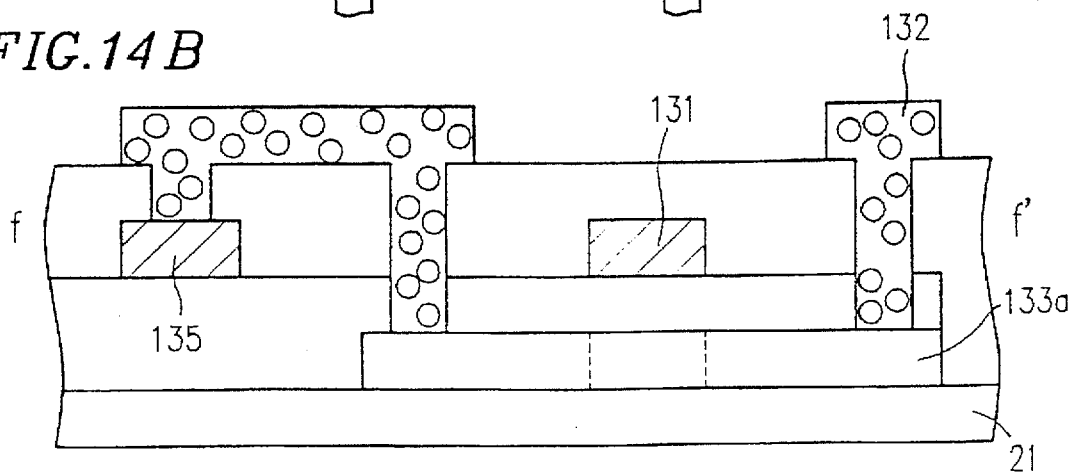
FIG. 14B is a cross-sectional view taken along line f—f' in FIG. 14A.

In FIG. 4, like reference numerals used in FIG. 14A designate like components, and consequently, detailed description thereof is omitted herein.

A signal wiring 227, which supplies output of a shift register (not shown in FIG. 4) to an analog switch 133, is installed so as to intersect video lines 134 indicated by B, G, and R. The signal wiring 227 is formed so as to include: a main portion 207, which is formed by patterning a polysilicon thin film or the like, having disconnected portions 207a in the vicinity of a transistor region (an active layer) 133a of a TFT constituting the analog switch 133; and a connecting portion 217, which is formed by patterning an aluminum film or the like, for interconnecting the disconnected portions 207a.

Similarly as in the first example, in the second example thus constituted, ion implantation for determining the polarity of the transistor is conducted after forming the main portion 207 of the signal wiring (the gate line) 227 leading to the analog switch 133. Thereafter, the disconnected portions 207a are interconnected by means of a metal to be used in the subsequent step. Thus, the breakdown of the gate insulating film of the analog switch 133 due to the charge-up thereof can be prevented.

EXAMPLE 3

Figure 5A:
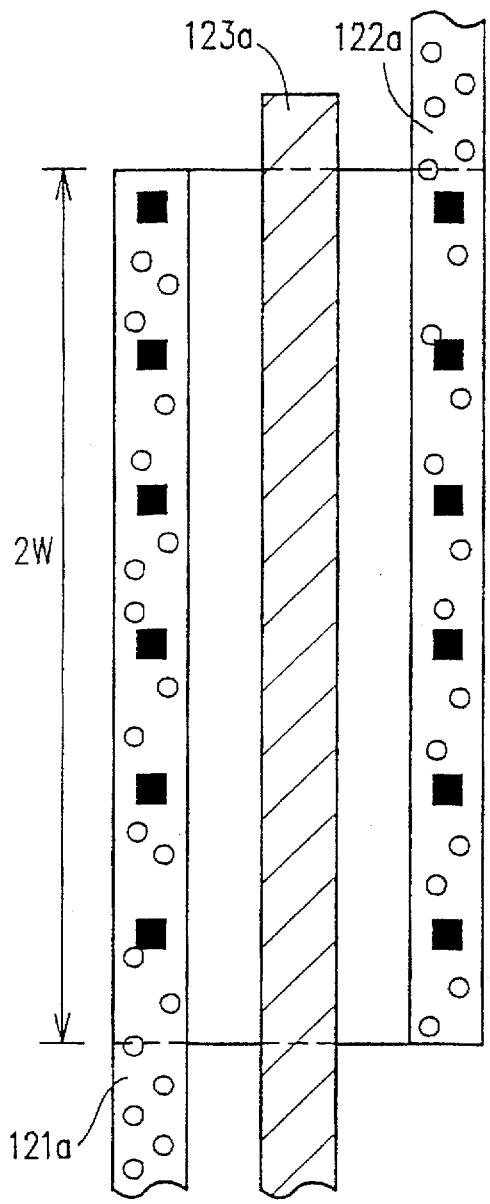
FIG. 5A is an exemplary schematic plan view illustrating a conventional analog switch.
Figure 5B:
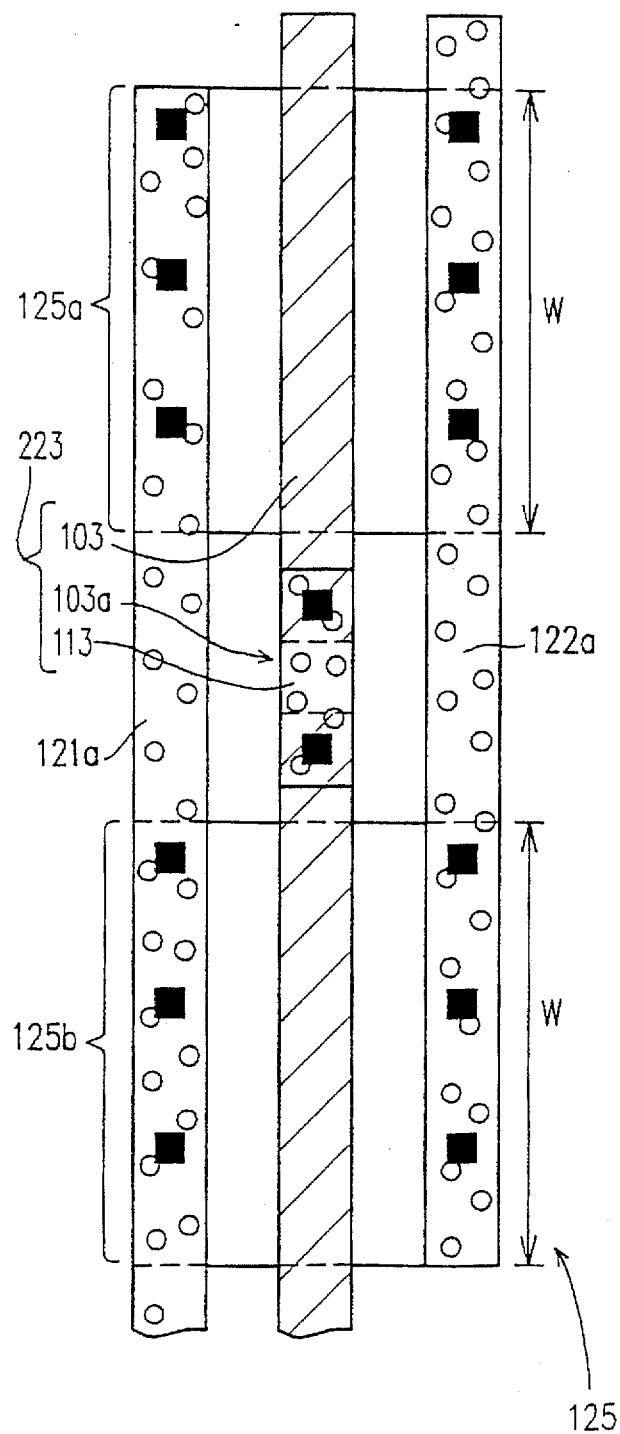
FIG. 5B is a schematic plan view illustrating an analog switch constituting a driver monolithic liquid crystal display device according to a third example of the present invention.

FIGS. 5A and 5B are views illustrating a liquid crystal display device according to a third example of the present invention.

The present example specifically relates to such TFTs as used in a buffer region of a gate driver or a source driver, or in an analog switch for sampling the video signals in the liquid crystal display device. These TFTs typically have a width of 100 μm or more, unlike the TFTs to be used in the other portions of the liquid crystal display device.

FIG. 5A shows a typical configuration of such a TFT having a wide width (2W). In FIG. 5A are shown: a signal-input line 121a; a signal-output line 122a; and a gate electrode 123a. In such TFTs as having a wider width, the breakdown of the gate insulating film during the ion implantation process is more likely to occur as compared with the TFTs having a reduced width.

According to the present invention, however, a TFT 125 is divided into two TFT segments 125a and 125b each having a width of W, as shown in FIG. 5B. Between thus divided two TFT segments 125a and 125b, the gate electrode 223 is in turn divided into two segments, which are interconnected by another line after the ion implantation process, thereby preventing the breakdown of the TFT 125. A signal-input line 121a and a signal-output line 122a are similarly provided on the respective sides of the gate electrode 223.

Specifically, the TFT constituting the analog switch typically has a channel width of 100 μm or more so that it is divided into a plurality of segments 125a and 125b, which are aligned in the direction of the channel width. The gate electrode 223 of the TFT 125 is formed so as to include: a main portion 103, which is formed by patterning a polysilicon film or the like, having disconnected portions 103a between the adjacent segments 125a and 125b; and the connecting portion 113, which is formed by patterning aluminum or the like, for interconnecting the disconnected portions 103a.

According to such a structure of the gate electrode 223, similarly as in the previous examples, the breakdown due to the charge-up of the analog switch can be prevented.

EXAMPLE 4

Figure 6:
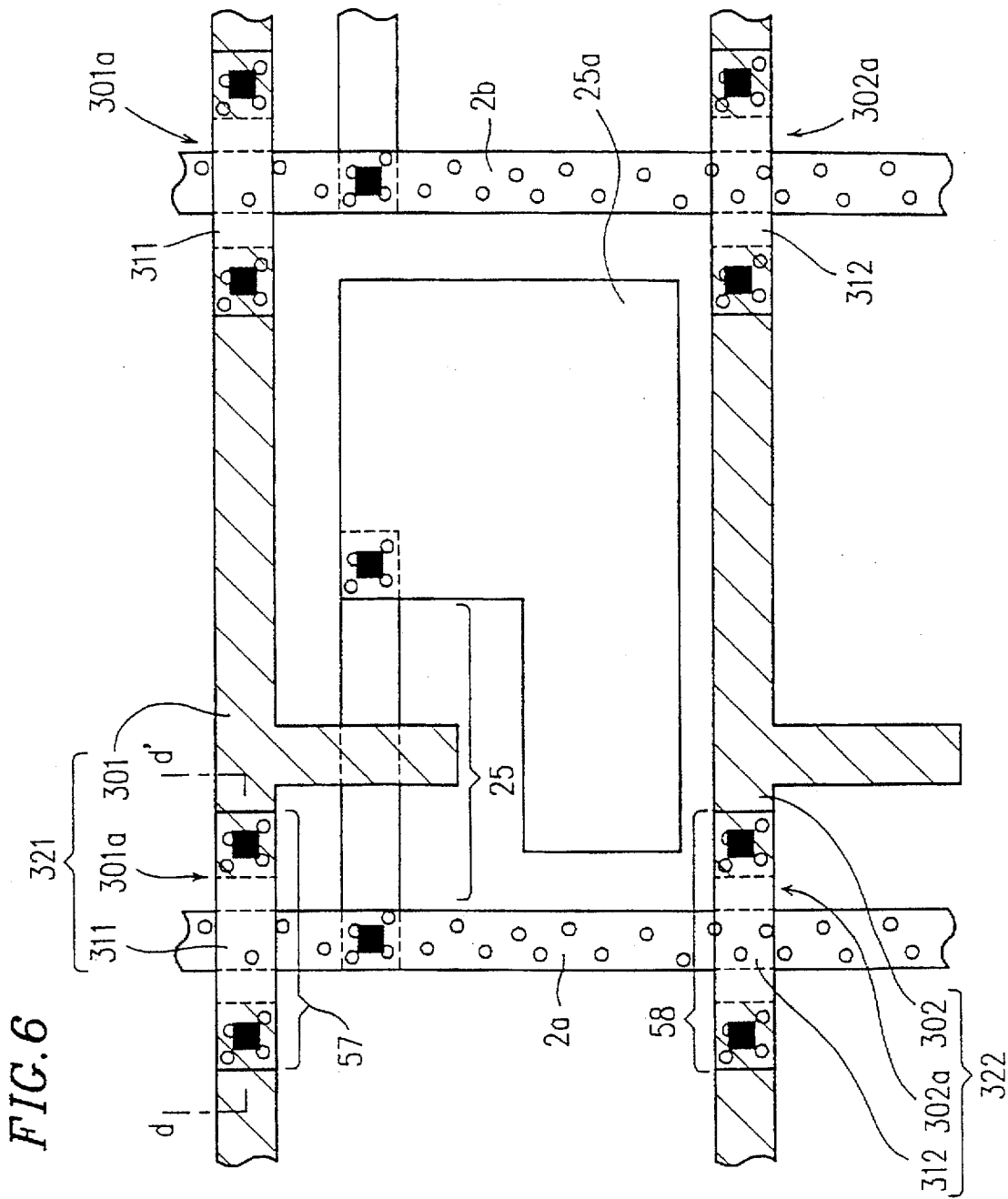
FIG. 6 is a schematic plan view illustrating a pixel portion on an active matrix substrate constituting a driver monolithic liquid crystal display device according to a fourth example of the present invention.
Figure 7:
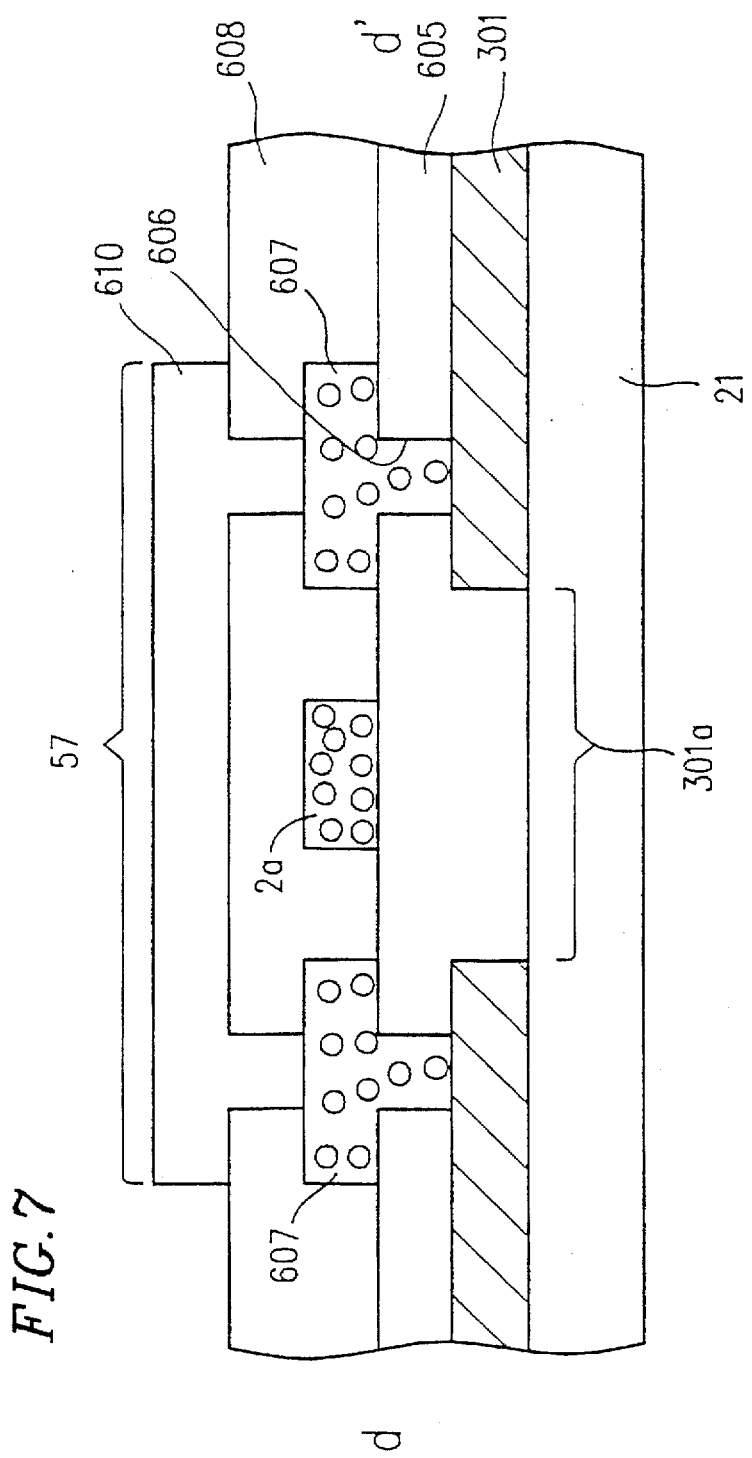
FIG. 7 is a cross-sectional view taken along line d—d' in FIG. 6.

FIG. 6 is a view illustrating a liquid crystal display device according to a fourth example of the present invention, which shows an enlargement of a pixel on an active matrix substrate. FIG. 7 is a cross-sectional view taken along the line d—d' in FIG. 6. In these drawings, like components are designated with like reference numerals.

In this example, in order to prevent the breakdown of a TFT in a liquid crystal display unit of the liquid crystal display device during the ion implantation process, a main portion of a gate bus line is constituted so that it has disconnected portions for each of the pixels. Such disconnected portions are interconnected by means of a metal layer to be used in the subsequent step.

Figure 15:
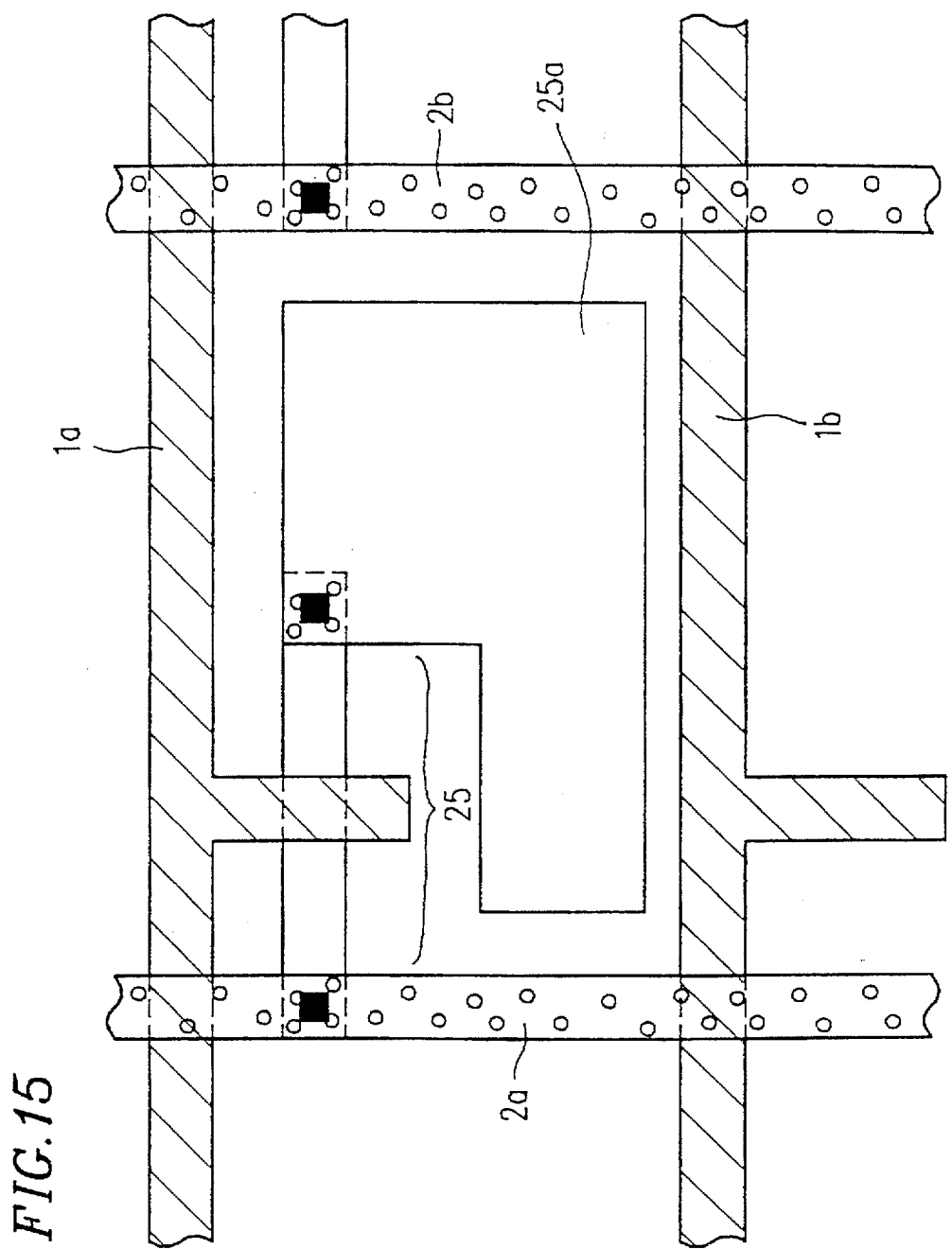
FIG. 15 is a schematic plan view illustrating a typical conventional pixel portion on an active matrix substrate constituting a conventional driver monolithic liquid crystal display.

In FIG. 6, like reference numerals used in FIG. 15 designate like components. Therefore, detailed description thereof is omitted herein.

In the present example, a gate bus line 321 is formed so as to include: a main portion 301, which is formed by patterning a polysilicon film or the like, having a disconnected portion 301a for each of the pixels at an intersection 57 with a source bus line 2a; and a connecting portion 311, which is formed by patterning an aluminum film or the like, for interconnecting the disconnected portion 301a. Another gate bus line 322 also includes: a main portion 302 having a disconnected portion 302a for each of the pixels at an intersection 58 and a connecting portion 312 for interconnecting the disconnected portion 302a, similarly to the above-mentioned gate bus line 321.

The disconnected portions 301a of the gate bus line 321 cannot be interconnected by the same layer of a metal film which constitutes the source bus line 2a. Therefore, as shown in FIG. 7, the main portion 301 of the gate bus line 321 and the aluminum layer 607 are connected to each other through the contact holes 606 in the first interlayer insulating film 605. Then, the disconnected portion 301a at the intersection 57, between the source bus line 2a and the gate bus line 321, are interconnected by the metal layer 610 made of TiW or Mo.

Thus, in the present example, with respect to the gate bus lines 321 and 322, a portion of which respectively functions as the gate electrode of the pixel TFT 25, only the main portions 301 and 302 having the disconnected portions 301a and 302a for each of the pixels are formed prior to the ion implantation process. Accordingly, the breakdown of the gate insulating film in the pixel TFT 25 during the ion implantation process can be prevented.

When a metal material used for the connecting portion 311 and 312 has a resistance lower than that of the gate electrode, signal delay on the gate bus lines 321 and 322 can also be prevented.

Although, in FIG. 6, the disconnected portions 301a and 302a of the gate bus lines 321 and 322 are interconnected at the intersections 57 and 58 between the source bus line 2a and 2b and the gate bus line 321 and 322, the present invention is not limited thereto.

Figure 8:
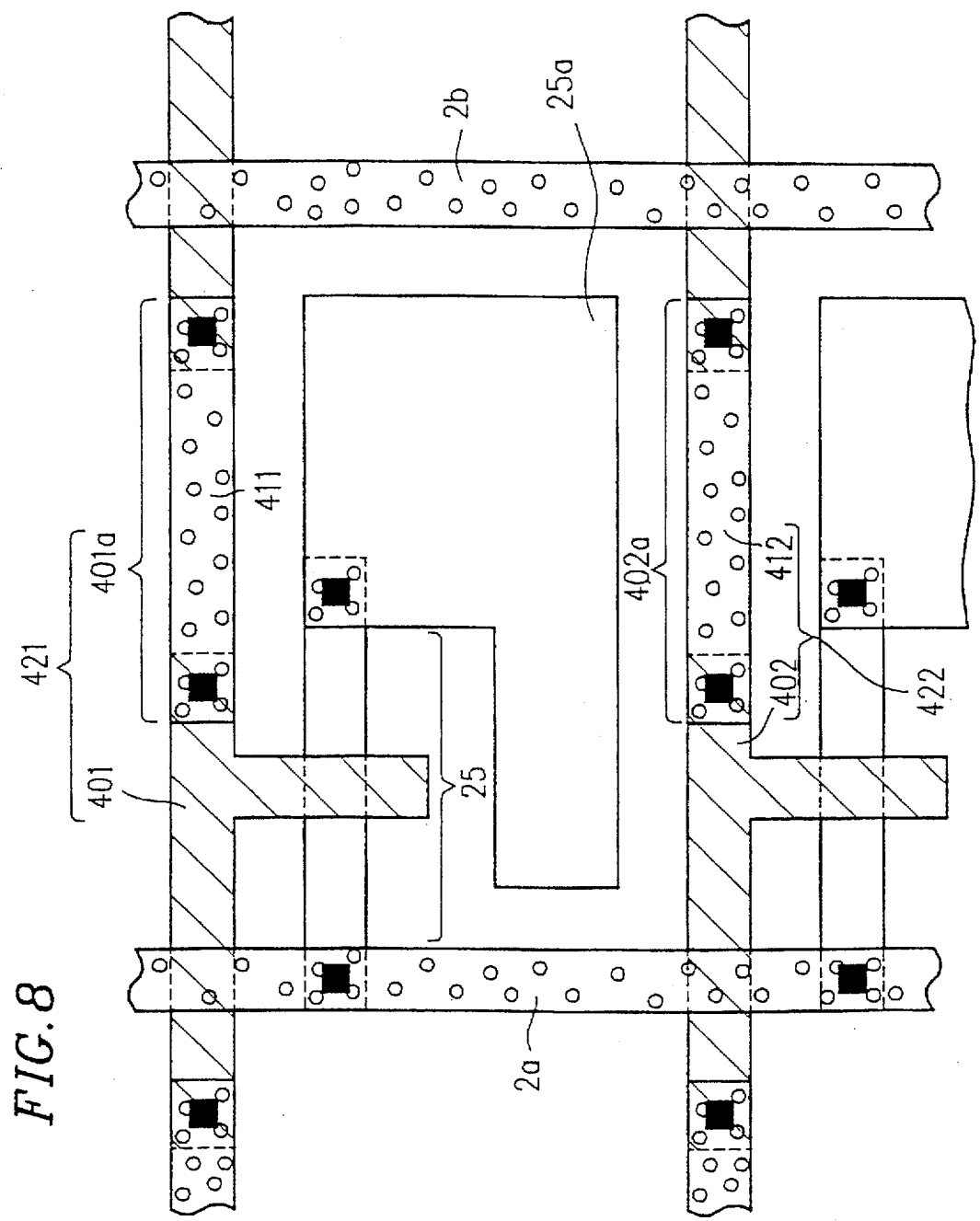
FIG. 8 is a schematic plan view illustrating a modified structure of the pixel portion on the active matrix substrate constituting the driver monolithic liquid crystal display device according to the fourth example of the present invention.
Figure 9:
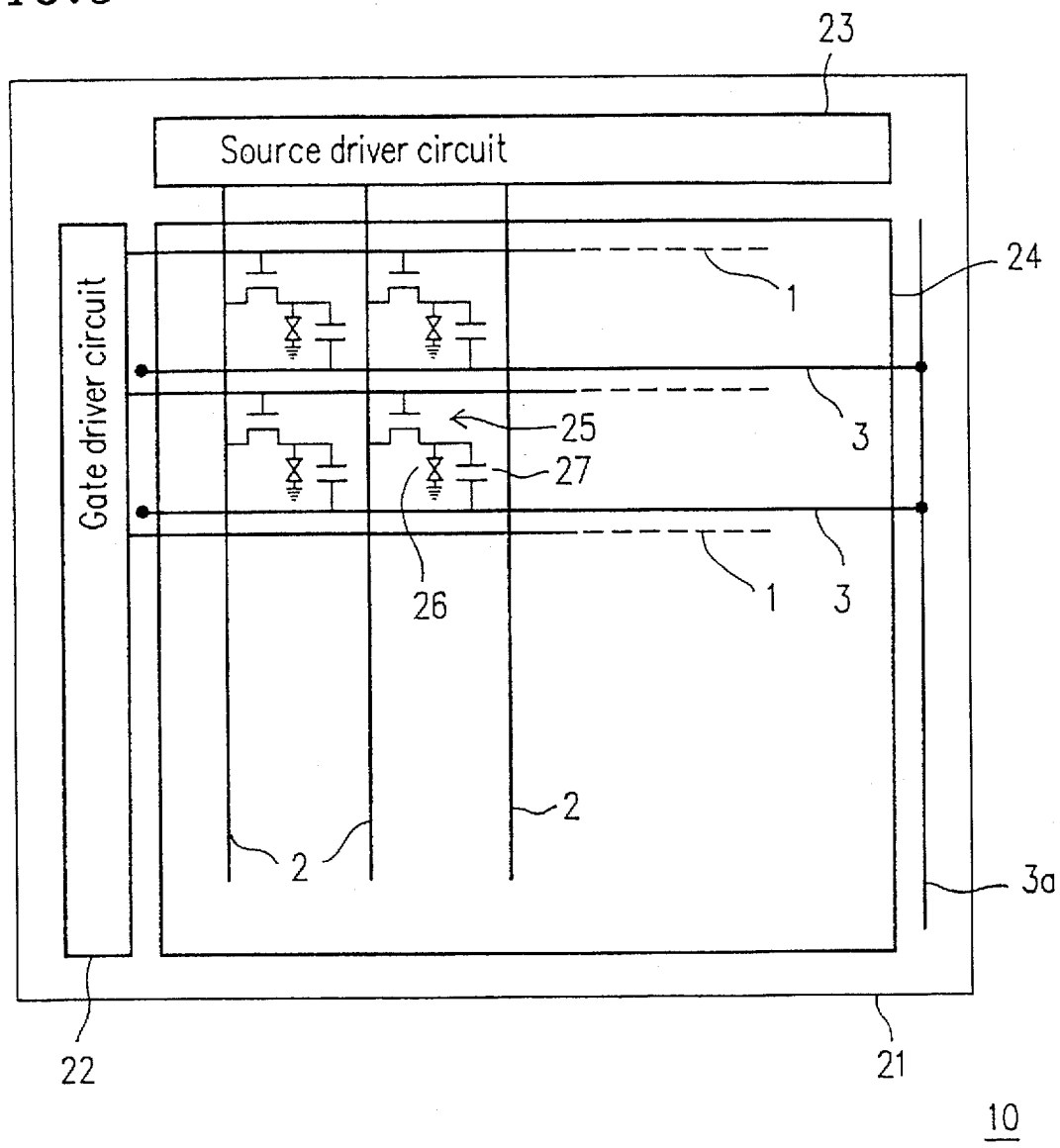
FIG. 9 is a schematic diagram illustrating a typical configuration of a driver monolithic liquid crystal display device.

For example, FIG. 8 shows an exemplary modification of the present example. In FIG. 8, like components are designated with like reference numerals as in FIG. 7.

Specifically, as shown in FIG. 8, it is also possible to form a gate bus line 421 so as to include: a main portion 401, which is formed by patterning a first wiring layer, having a disconnected portion 401a between two adjacent source bus lines 2a and 2b for each pixel; and a connecting portion 411, which is formed by patterning a second wiring layer which is different from the first wiring layer, for interconnecting the disconnected portions 401a. Furthermore, it is also possible to form a gate bus line 422 so as to include: a main portion 402 having a disconnected portion 402a for each pixel and a connecting portion 412 for interconnecting the disconnected portion 402a, similarly to the above gate bus line 421.

EXAMPLE 5

Figure 10:
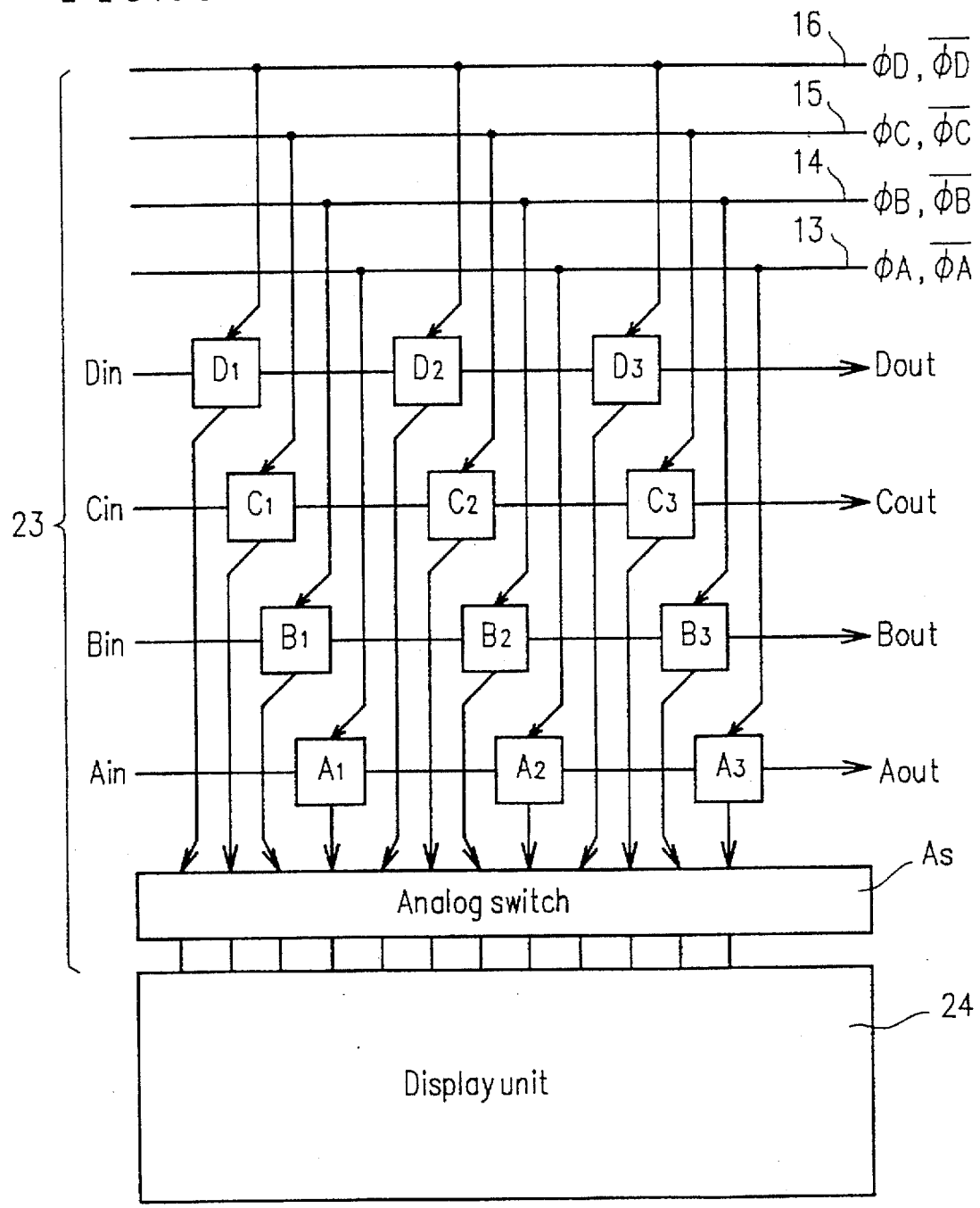
FIG. 10 is a schematic plan view illustrating a portion of a typical conventional source driver circuit constituting the driver monolithic liquid crystal display device shown in FIG. 9.
Figure 17:
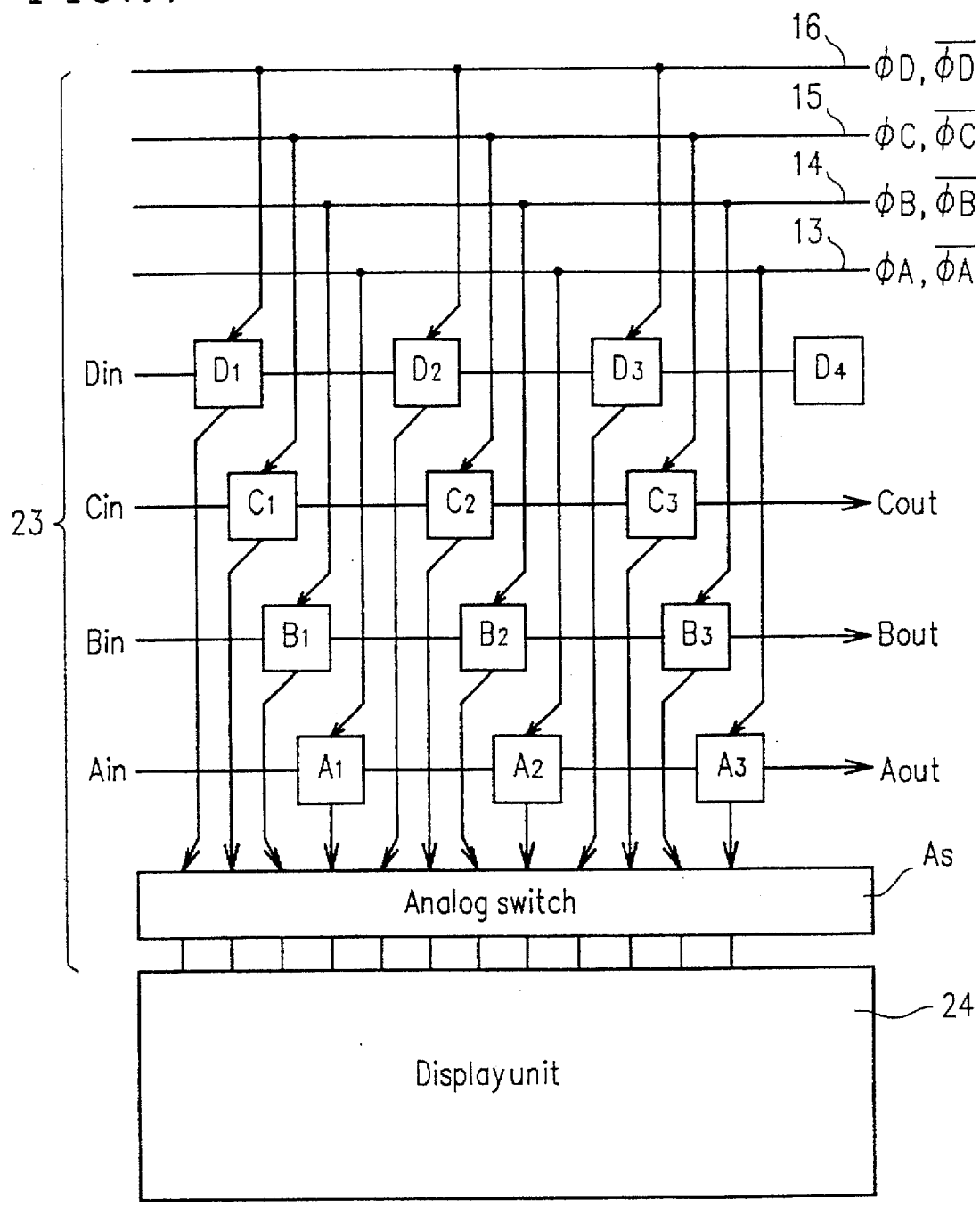
FIG. 17 is a schematic plan view illustrating a portion of a source driver circuit constituting a driver monolithic liquid crystal display device according to a fifth example of the present invention.

FIG. 17 shows a portion of the configuration of a source driver of a driver monolithic liquid crystal display device according to Example 5 of the invention. In FIG. 17, like reference numerals used in FIG. 10 designate like components.

The liquid crystal display device of the example includes a dummy unit shift register D4, which is connected at the output side of the unit shift register D3. The dummy sift register D4 does not provide output pulse to the analog switch As, unlike the other unit shift registers D1 to D3 in the same group.

Each of the unit shift registers A1 to A3, B1 to B3, C1 to C3 and D1 to D3 has the same configuration as those described in Example 1. The dummy unit shift register D4 also has the similar configuration to some extent, and further includes a dummy signal wiring connected to the gate electrode of the TFT constituting the dummy unit shift register D4. The dummy signal wiring is intentionally formed so as to be vulnerable to the aforementioned breakdown of the gate insulating film during the ion implantation process.

Figure 18:
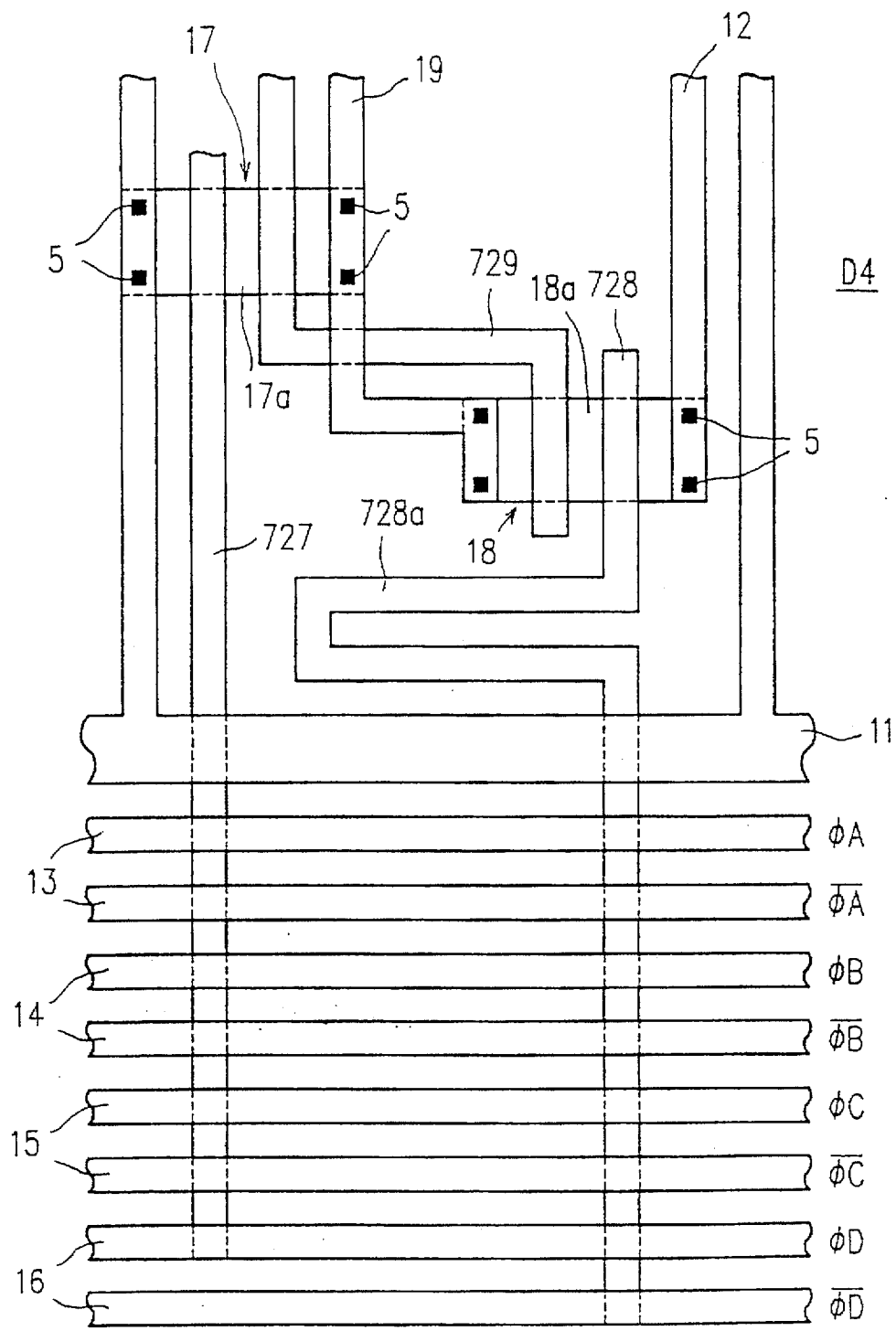
FIG. 18 is a schematic plan view illustrating a portion of the source driver circuit constituting the driver monolithic liquid crystal display device according to the fifth example of the present invention.

FIG. 18 is a plan view illustrating a portion of the shift register constituting the source driver of the present example, and specifically shows a layout of the dummy unit shift register D4 on the substrate. In FIG. 18, like reference numerals used in FIG. 11 designate like components.

Dummy signal wiring 727 and 729 are formed without disconnected portions or connecting portion for interconnecting therein, respectively, in order to intentionally cause the breakdown therein. In addition, a meandering portion 728a is provided in a dummy signal wiring 728 in order to intentionally induce the breakdown there. Alternatively, the dummy signal wiring 728 may be formed, instead of having the meandering portion 728a, with the similar configuration to the conventional signal wiring which has no disconnected portion or connecting portion. No contact hole is provided for connecting the dummy signal wirings 727 and 728 and a clock line 16.

In the above configuration of the shift register of the present example, the breakdown is likely to occur first at the dummy signal wirings 727, 728 and 729 included in the dummy unit shift register D4. Thus, it is possible to prevent the breakdown from occurring at other portions in the shift register involved in the signal transmission, such as in the TFT or along other signal wirings.

Specifically, in the dummy unit shift register D4 according to the present example, the dummy signal wirings 727 and 729 are respectively formed without disconnected portions therein, while the dummy signal wiring 728 is formed with the meandering portion 728a. Consequently, the lengths of the respective dummy signal wirings 727 through 729 become longer as compared to the gate wiring length (length between a gate electrode and a disconnected portion) in other signal wirings having the disconnected portion, thereby inducing the occurrence of breakdown in the dummy unit shift register D4. The breakdown in the other unit shift registers A1 to A3, B1 to B3, C1 to C3 and D1 to D3 is in turn prevented from occurring.

Moreover, no contact holes for connecting the dummy signal wirings 727 and 728 and the clock line 16 are provided. As a result, even when the breakdown occurs in the TFTs 17 and 18 included in the dummy unit shift register D4, no adverse effects occur to the clock line 16.

In the above description of the present example, the dummy unit shift register D4, in which the breakdown is likely to occur more easily as compared to the other unit shift register A1 to A3, B1 to B3, C1 to C3 and D1 to D3, is provided as the last stage of the shift register group, thereby preventing the breakdown in the unit shift registers A1 to A3, B1 to B3, C1 to C3 and D1 to D3. Alternatively, other modifications are applicable according to the present example.

For example, a dummy pixel pattern which has no contribution to the display operation may be provided in the periphery of the display unit in the liquid crystal display device. Additional TFT is further provided as corresponding to the thus provided dummy pixel pattern. By providing such additional TFT with a pattern in which the breakdown is likely to occur, the breakdown in the TFTs included in the display unit is prevented.

For the purpose, gate bus lines corresponding to the dummy pixel pattern may be formed with a meandering portion or without a disconnected portion, unlike other gate bus lines with disconnected portions which are provided in the display unit.

In the present invention, with respect to at least one of a plurality of TFTs constituting a liquid crystal display device, a signal wiring having one end functioning as a gate electrode of the TFT is formed so as to include: a main portion, which is formed by patterning a first wiring layer, having a disconnected portion in the vicinity of a transistor region (an active region) of the transistor; and a connecting portion, which is formed by patterning a second wiring layer which is different from the first wiring layer, for interconnecting the disconnected portion. The ion implantation process, which may cause the charge-up of the signal wiring, can be performed after forming the main portion, and subsequently the connecting portion is formed so as to interconnect the disconnected portion of the signal wirings. Thus, the breakdown of the gate insulating film of the TFTs during the ion implantation process can be prevented.

Therefore, in accordance with the present invention, in the driver monolithic liquid crystal display device, defects in the shift registers, containing the TFTs as their circuit elements, can be reduced significantly.

Moreover, in the present invention, with respect to at least one of a plurality of TFTs constituting a liquid crystal display device, a signal wiring for inputting a clock signal to the gate electrode of the TFT may include: a main portion having a disconnected portion; and a connecting portion for interconnecting the disconnected portion. As a result, the breakdown of the gate insulating film can be prevented, and furthermore, resistances of the wirings between the respective clock lines and the shift register can be equalized by adjusting the resistances of the main portion and of the connecting portion.

Therefore, the clock signal is seldom out of synchronization and the shift registers are free from malfunction.

Furthermore, in the present invention, a gate bus line, a portion of which functions as a gate electrode of a TFT, is formed so as to include: a main portion having a disconnected portion for each pixel and a connecting portion for interconnecting the disconnected portion. As a result, the breakdown of the gate insulating film can be prevented, and furthermore, the resistance of the gate bus line can be reduced by composing the connecting portion of a low-resistance material, thereby preventing signal delay.

Moreover, in the present invention, with respect to at least one of a plurality of TFTs constituting a liquid crystal display device, a dummy signal wiring is connected to the gate electrode thereof. No signal is applied to the dummy signal wiring. The dummy signal wiring is formed of the same material in the same layer as the gate electrode, by patterning a predetermined wiring layer. Moreover, by making a length of the dummy signal wiring longer than a gate wiring length (i.e., a length between the gate electrode and the disconnected portion) of the other signal wirings, the breakdown of the gate insulating film, caused by the accumulation of charges to the signal wirings during the ion implantation process after the formation of the signal wirings, is likely to occur in the dummy signal wiring in a concentrated manner. As a result, the breakdown of the gate insulating film along the other signal wirings can be suppressed.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A driver monolithic liquid crystal display device comprising:
 a plurality of top-gate type thin-film transistors formed on an insulative substrate; and
 a plurality of signal wirings for providing a signal to a gate electrode of each of the thin-film transistors,
 wherein at least one signal wiring which is selected among the plurality of the signal wirings comprises:
  a main portion formed of the same material as that of the gate electrode by patterning a first wiring layer, the main portion having two subportions which are separated in the first wiring layer by a disconnection; and
  a connecting subportion for interconnecting the two subportions which are separated in the first layer by the disconnection, the connecting subportion being formed by patterning a second wiring layer.

2. A driver monolithic liquid crystal display device according to claim 1, wherein the disconnection is provided in the vicinity of an active layer of the thin-film transistor.

3. A driver monolithic liquid crystal display device according to claim 1, wherein the plurality of the thin-film transistors constitute a shift register, and the selected signal wiring provides a clock signal from a clock line to the thin-film transistors.

4. A driver monolithic liquid crystal display device according to claim 1, wherein the plurality of the thin-film transistors constitute an analog switch, and the plurality of signal wirings are provided as intersecting with video lines, the selected signal wiring providing an output of a shift register to the analog switch.

5. A driver monolithic liquid crystal display device according to claim 1,
 wherein the plurality of the thin-film transistors include at least one N-channel thin-film transistor and at least one P-channel thin-film transistor, the at least one N-channel transistor and the at least one P-channel transistor constituting an inverter included in a shift register,
 wherein the selected signal wiring is connected to the inverter, and is provided so as to extend over respective channels of the N-channel and P-channel thin-film transistors constituting the inverter,
 and wherein the disconnection of the selected signal wiring is provided between respective active layers of the N-channel and P-channel thin-film transistors.

6. A driver monolithic liquid crystal display device according to claim 5, wherein the inverter is a clocked inverter.

7. A driver monolithic liquid crystal display device according to claim 1,
 wherein the plurality of the thin-film transistors are provided as corresponding to respective pixels constituting a display unit,
 and wherein the selected signal wiring is a gate bus line.

8. A driver monolithic liquid crystal display device according to claim 7, wherein the disconnection of the gate bus line is provided at an intersection between the gate bus line and a source bus line for each pixel.

9. A driver monolithic liquid crystal display device according to claim 7, wherein the disconnection of the gate bus line is provided between adjacent source bus lines for each pixel.

10. A driver monolithic liquid crystal display device according to claim 1, wherein the second wiring layer is an upper wiring layer formed of aluminum.

11. A driver monolithic liquid crystal display device according to claim 1, wherein the second wiring layer is an upper wiring layer formed of a material selected from a group consisting of TiW, Ti, Mo, W and WSi.

12. A driver monolithic liquid crystal display device according to claim 1, wherein respective non-selected signal wirings among the plurality of the signal wirings have no disconnection.

13. A driver monolithic liquid crystal display device comprising a plurality of thin-film transistors formed on an insulative substrate,
wherein at least one thin-film transistor which is selected among the plurality of the thin-film transistors is divided into a plurality of segments and has a channel divided in a channel width direction into a plurality of channel segments, a total width of the channel being 100 :m or more, the selected thin-film transistor comprising a gate electrode, the gate electrode comprising:
a main portion formed by patterning a first, wiring layer, the main portion having two subportions which are separated in the first wiring layer by a disconnection, the disconnection being between between the segments of the selected thin-film transistor; and
a connecting subportion for interconnecting the two subportions which are separated in the first layer by the disconnection the connecting subportion being formed by patterning a second wiring layer.

14. A driver monolithic liquid crystal display device according to claim 13, wherein the second wiring layer is an upper wiring layer formed of aluminum.

15. A driver monolithic liquid crystal display device according to claim 13, wherein the second wiring layer is an upper wiring layer formed of a material selected from a group consisting of TiW, Ti, Mo, W and WSi.

16. A driver monolithic liquid crystal display device according to claim 13, wherein respective non-selected thin-film transistors among the plurality of the thin-film transistors have a gate electrode having no disconnected portion.

17. A driver monolithic liquid crystal display device comprising:
a plurality of shift registers, each of the plurality of the shift registers having a plurality of top-gate type thin-film transistors formed on an insulative substrate,
wherein the plurality of the shift registers include a dummy unit shift resistor having at least one top-gate type thin-film transistor, the at least one top-gate type thin-film transistor has a dummy signal wiring connected to a gate electrode thereof, the dummy signal wiring being formed of the same material as that of the gate electrode by patterning a predetermined wiring layer, the dummy signal wiring having a continuous wiring pattern.

18. A driver monolithic liquid crystal device according to claim 17, wherein a length of the dummy signal wiring is longer than a gate wiring length of other signal wirings each of which provides a signal to a gate electrode of the non-selected thin-film transistors among the plurality of the thin-film transistors.

* * * * *